(12) United States Patent
Shimizu et al.

(10) Patent No.: US 8,362,998 B2
(45) Date of Patent: Jan. 29, 2013

(54) DRIVE CIRCUIT, DISPLAY DEVICE PROVIDED WITH SUCH DRIVE CIRCUIT AND METHOD FOR DRIVING DISPLAY DEVICE

(75) Inventors: Shinsaku Shimizu, Jiangsu Province (CN); Yuhichiroh Murakami, Matsusaka (JP)

(73) Assignee: Sharp Kabushiki Kaisha, Osaka (JP)

( * ) Notice: Subject to any disclaimer, the term of this patent is extended or adjusted under 35 U.S.C. 154(b) by 1021 days.

(21) Appl. No.: 12/085,925

(22) PCT Filed: Sep. 7, 2006

(86) PCT No.: PCT/JP2006/317777
§ 371 (c)(1),
(2), (4) Date: May 30, 2008

(87) PCT Pub. No.: WO2007/083410
PCT Pub. Date: Jul. 26, 2007

(65) Prior Publication Data
US 2009/0267924 A1    Oct. 29, 2009

(30) Foreign Application Priority Data
Jan. 23, 2006  (JP) .................................. 2006-014320

(51) Int. Cl.
*G09G 3/36*    (2006.01)

(52) U.S. Cl. ......................................... 345/100; 377/64

(58) Field of Classification Search ............ 345/87–104, 345/204–206; 377/64–81; 326/68–72, 83, 326/84, 114, 115
See application file for complete search history.

(56) References Cited

U.S. PATENT DOCUMENTS

| | | | |
|---|---|---|---|
| 5,898,322 A | 4/1999 | Kubota et al. | |
| 2001/0017609 A1 | 8/2001 | Okumura et al. | |
| 2004/0004593 A1 | 1/2004 | Okumura et al. | |
| 2005/0175138 A1 | 8/2005 | Matsuda et al. | |
| 2006/0077198 A1 | 4/2006 | Okumura et al. | |

FOREIGN PATENT DOCUMENTS

| | | |
|---|---|---|
| JP | 05-002889 | 1/1993 |
| JP | 08-082786 | 3/1996 |
| JP | 11-282397 | 10/1999 |
| JP | 2001-228830 | 8/2001 |
| JP | 2001-237688 | 8/2001 |
| JP | 2002-006791 | 1/2002 |
| JP | 2004-126551 | 4/2004 |
| JP | 3536657 B | 6/2004 |
| JP | 2005-222655 | 8/2005 |
| KR | 000175228 B | 3/1999 |
| TW | 000594632 B | 6/2004 |

*Primary Examiner* — Amr Awad
*Assistant Examiner* — Aaron Midkiff
(74) *Attorney, Agent, or Firm* — Harness, Dickey & Pierce, P.L.C.

(57) ABSTRACT

While an output signal of a flip-flop is inactive in a shift register, NAND circuits of clock pulse extracting sections prevent the performing of conduction switching operation in accordance with periodic level change of clock signals between a logical derivation path for High output and a logical derivation path for Low output, by input of the output signal.

15 Claims, 14 Drawing Sheets

FIG. 3
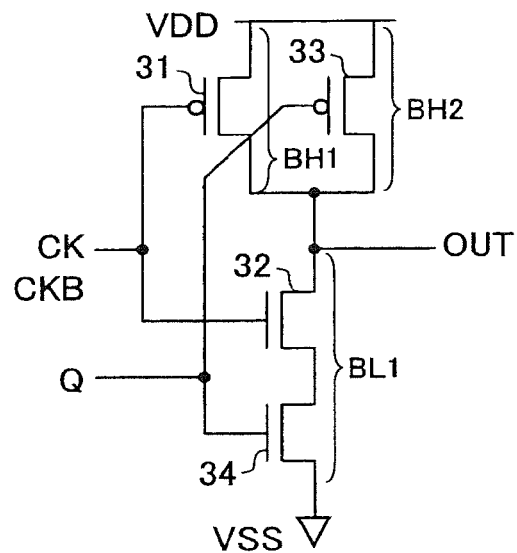
FIG. 4
(a)
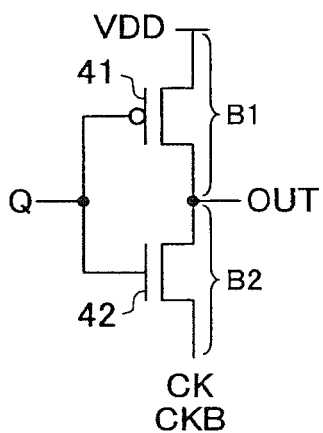
(b)
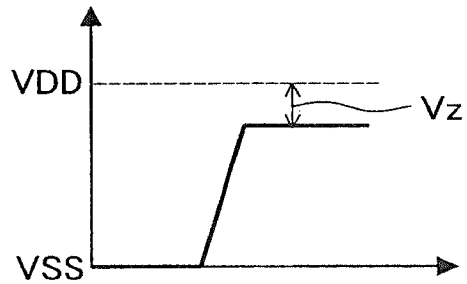
FIG. 5
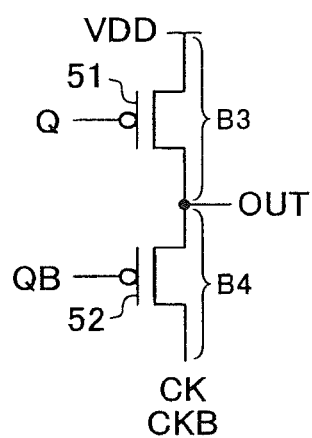

FIG. 6
(a) VTHnand ≧ VTHnor
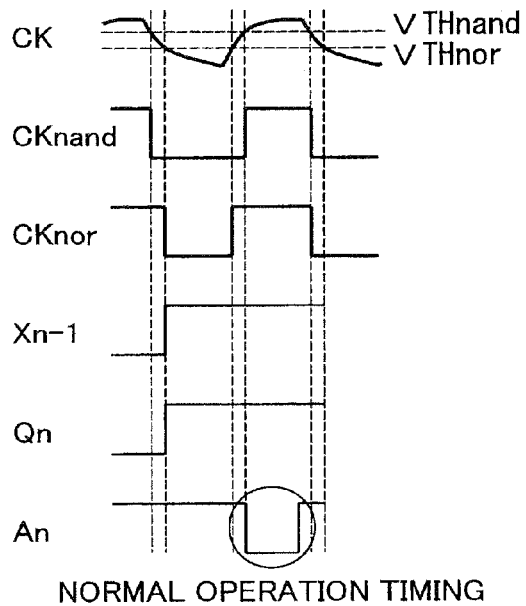
NORMAL OPERATION TIMING
(b) VTHnand < VTHnor
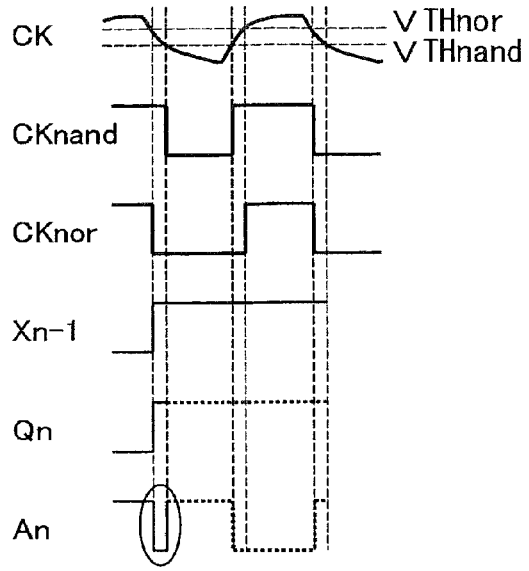
HAZARD
(c) VTHnand < VTHnor
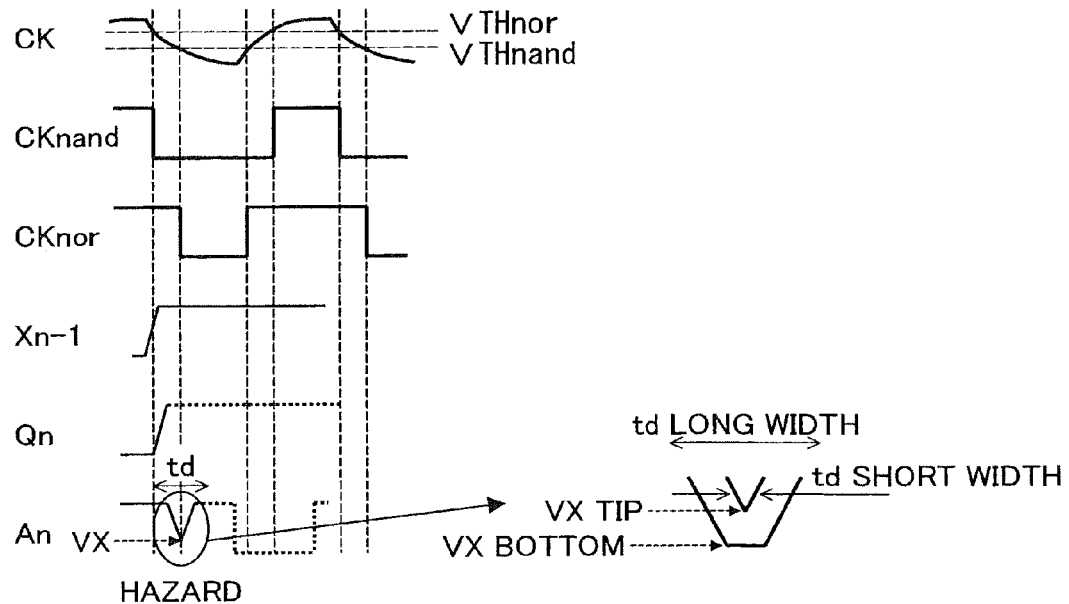
HAZARD FIG. 16
(a)
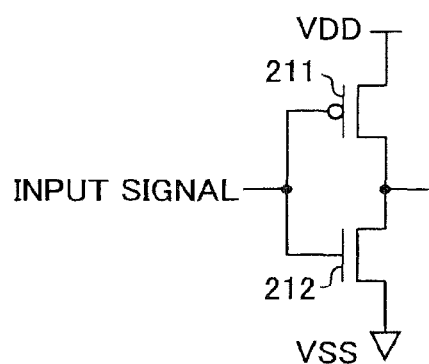
(b)
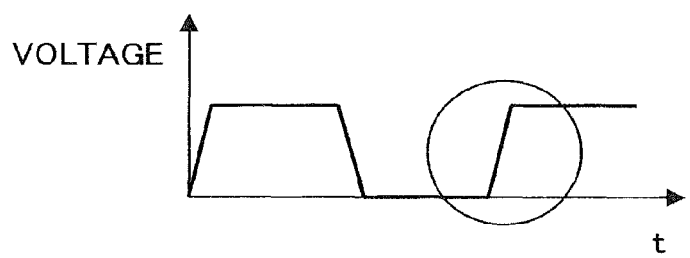
(c)
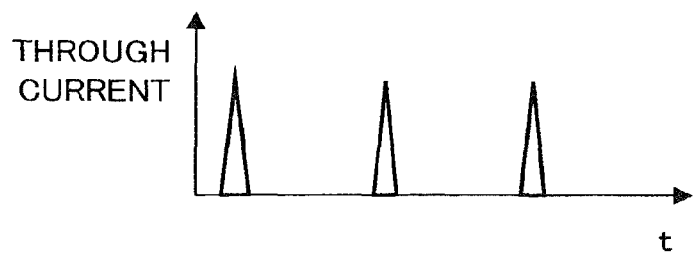

DRIVE CIRCUIT, DISPLAY DEVICE PROVIDED WITH SUCH DRIVE CIRCUIT AND METHOD FOR DRIVING DISPLAY DEVICE

TECHNICAL FIELD

The present invention relates to a driving circuit which drives a display panel of a liquid crystal display device or the like.

BACKGROUND ART

A liquid crystal display device includes a source driver circuit and a gate driver circuit as driving circuits for driving a display panel. For these driving circuits, a shift register is used for generating a drive signal which controls a drive timing of the display panel. An example of such a shift register is illustrated in FIG. 12.

A shift register 101 as illustrated in FIG. 12 includes a set/reset type flip-flop 102 (102-1, 102-2, ...) and a CMOS analog switch 103 (103-1, 103-2, ...) in each stage. In addition, the shift register 101 is arranged so that it receives a start pulse SP and two clock signals CK and CKB. The two clock signals CK and CKB have different phases to each other.

The set/reset type flip-flop (hereafter referred as 'flip-flop') 102 is set by receiving an active set signal at an S terminal thereof. This causes an output signal Q (Q1, Q2, ...) which is outputted from a Q terminal change to High. The High output state is continuously maintained even if the set signal becomes inactive. The flip-flop 102 resets itself when an R terminal thereof receives an active reset signal, to which the output signal Q changes to Low. The Low output state is continuously maintained until the next active set signal is received, even if the reset signal becomes inactive.

Of each of the flip-flops 102, a flip-flop 102-1 receives the start pulse SP as the set signal. The flip-flop 102-1 is in the first stage of the shift register 101, and illustrated as the leftmost stage in FIG. 12. Each of the flip-flops 102 following the flip-flop 102-1 receive an output signal X (X1, X2, ...) from the analog switch 103 which corresponds to a flip-flop 102 preceding that flip-flop 102, respectively. The output signal X from the preceding stage is used as the set signal for that flip-flop 102. In addition, each flip-flop 102 receives an output signal X (X2, X3 ...) from the analog switch 103 which corresponds to a flip-flop 102 following that flip-flop 102, respectively. The output signal X from the next stage is used as the reset signal for that flip-flop 102.

Each of the analog switches 103 is ON while the High output signal Q (Q1, Q2, ...) is outputted from the corresponding flip-flop 102. Meanwhile, the clock signal CK or CKB is outputted from each analog switch 103 as the output signal X (X1, X2, ...). This signal is outputted as the output signal of the shift register 101. Specifically, the analog switches 103 which correspond to the flip-flops 102 of the odd stages output the clock signal CK, and the analog switches 103 which correspond to the flip-flops 102 of the even stages output the clock signal CKB.

The analog switch 103 is formed from a PMOS transistor and an NMOS transistor connected in parallel. An inverter 104 is provided in each analog switch 103, and supplies control signals in complementary levels to gates of the PMOS transistor and the NMOS transistor.

Consequently, the clock signal CK or the clock signal CKB is inputted to the flip-flop 102 of the next stage (the one latter stage). This clock signal CK or CKB is used as the set signal, as above. The clock signal CK or the clock signal CKB is also inputted to the flip-flop 102 of the preceding stage (the one preceding stage). This clock signal CK or CKB is used as the reset signal. Note that the clock signal CK and the clock signal CKB are the output signals X.

In this arrangement, the start pulse SP is inputted to the flip-flop 102-1 of the first stage as the set signal. When the flip-flop 102-1 of the first stage is set by receiving the set signal, an output signal Q1 changes to High.

The High output signal Q1 of the flip-flop 102-1 turns ON an analog switch 103-1 which corresponds to the flip-flop 102-1 of the first stage. Consequently, the analog switch 103-1 outputs the clock signal CK as an output signal X1. This output signal X1 is outputted as the output signal of the first stage of the shift register 101.

In addition, the output signal X1 is inputted to a flip-flop 102-2 of the second stage as the set signal thereof. Note that the output signal X1 is the clock signal CK. Accordingly, the flip-flop 102-2 of the second stage is set in the timing the output signal X1 changes to High. This causes an output signal Q2 to change to High as similar to the above. The High output signal Q2 of the flip-flop 102-2 of the second stage turns ON an analog switch 103-2 which corresponds to the flip-flop 102-2 of the second stage. Consequently, the analog switch 103-2 outputs the clock signal CKB as the output signal X2. This output signal X2 is outputted as the output signal of the second stage of the shift register 101.

The output signal X2 is inputted to a flip-flop 102-3 of the third stage as a set signal thereof, as similar to the above. Note that the output signal X2 is the clock signal CKB. Accordingly, the flip-flop 102-3 of the third stage is set in the timing the output signal X2 changes to High, to which an output signal Q3 changes to High. In addition, the output signal X2 is outputted to the preceding flip-flop 102 as the reset signal. That is, the output signal X2 is outputted to the flip-flop 102-1 of the first stage. The flip-flop 102-1 resets itself in the timing the output signal X2 changes to High. This changes the output signal Q1 to Low. Consequently, the analog switch 103-1 corresponding to the flip-flop 102-1 of the first stage turns OFF.

The set/reset operation of the flip-flops 102 and the ON/OFF operation of the analog switches 103 effected by the set/reset operation of the flip-flops 102, operated in each stage, enables the output of the output signals X (X1, X2, ...) from the shift register 101. The output signals X have the same width as the clock signals CK and CKB, and do not overlap with each other.

However, the above arrangement of the shift register 101 has a problem in that race hazard would possibly occur in the shift register 101 if a phase lag existed between the clock signals CK and CKB.

The race hazard is explained with reference to FIG. 13. FIG. 13 is a timing chart illustrating the operation of the shift register 101, in the case where a phase lag exists between the clock signals CK and CKB. The phase is lagged to which the phase of the clock signal CKB is delayed with respect to the phase of the clock signal CK.

A rise (A) of the start pulse SP sets the flip-flop 102-1 of the first stage. This changes the output signal Q1 to High. The analog switch 103-1 which corresponds to the flip-flop 102-1 of the first stage turns ON while the output signal Q1 is High. Thus, the clock signal CK is outputted as the output signal X1. The output signal X1 is inputted to the flip-flop 102-2 of the second stage as the set signal. Thus, the flip-flop 102-2 of the second stage is set when the output signal X1 is at a rise (B).

Consequently, the output signal Q2 changes to High.

However, since the phase of the clock signal CKB is lagged with respect to the phase of the clock signal CK, there is a period where both the clock signal CK and the clock signal CKB are High. The existence of this period results in output of a superfluous pulse PP as the output signal X2, before a proper pulse PPP of the clock signal CKB is outputted. The superfluous pulse PP outputted as the output signal X2 is equivalent to the amount of delay (lag) in the clock signal CKB is outputted. Because the output signal X2 is the set signal for the flip-flop 102-3 of the third stage, the flip-flop 102-3 is set at a timing (C) with the superfluous output signal X2, even though properly the flip-flop 102-3 should be set at a timing (D).

As a result of the above, an analog switch 103-3 which corresponds to the flip-flop 102-3 of the third stage outputs a High output signal X3 at the same timing as the output signal X1. This causes the flip-flops 102 in the third stage and the latter stages to be set all at the same time. Therefore, the shift register 101 is unable to operate properly, thereby causing the race hazard of the shift register 101.

The phase lag between the clock signals CK and CKB would also be generated while the clock signals CK and CKB are transmitted within the shift register 101.

Patent Document 1 is one technology to prevent such race hazard. A shift register described in Patent Document 1 is as illustrated in FIG. 14.

A shift register 201 as illustrated in FIG. 14 includes a flip-flop section 202 and a race hazard preventing section 203. The flip-flop section 202 has a set/reset type flip-flop 21 (21-1, 21-2, . . . ) on each stage. The race hazard preventing section 203 has a race hazard preventing circuit 22 (22-1, 22-2, . . . ) on each stage. Specifically, each of the stages in the shift register 201 has the set/reset type flip-flop (hereafter referred as simply 'flip-flop') 21, and corresponding to each of the flip-flops 21, one race hazard preventing circuit 22 is provided per stage. The race hazard preventing circuit 22 receives an output signal Q (Q1, Q2, . . . ) of the flip-flops 21, respectively. The shift register 201 is arranged so that it receives a start pulse SP and two clock signals CK and CKB. The two clock signals CK and CKB have different phases to each other.

The flip-flop 21-1, which is in the first stage of the flip-flop section 202 illustrated as the leftmost stage in FIG. 14, receives the start pulse SP. In response to the input of the start pulse SP to the flip-flop 21-1, the flip-flop section 202 outputs the output signals Q (Q1, Q2, . . . ) from the flip-flops 21 sequentially in order from the flip-flop 21 on the left end.

The set/reset type flip-flop 21 is set by receiving an active set signal at an S terminal thereof. This causes an output signal Q (Q1, Q2, . . . ) which is outputted from a Q terminal change to High. The High output state is continuously maintained even if the set signal becomes inactive. The flip-flop 21 resets itself when an R terminal thereof receives an active reset signal, to which the output signal Q changes to Low. The Low output state is continuously maintained until the next active set signal is received, even if the reset signal becomes inactive.

Of each of the flip-flops 21, the flip-flop 21-1 receives the start pulse SP as the set signal. The flip-flop 21-1 is illustrated as the leftmost stage in FIG. 14. Each of the flip-flops 21 following the first stage receives an output signal X (X1, X2, . . . ) from the race hazard preventing circuit 22 preceding that flip-flop 21 (corresponding race hazard preventing circuit 22), respectively. The output signal X from the preceding stage is used as the set signal for that flip-flop 21. The race hazard preventing circuit 22 receives the output signal Q (Q1, Q2, . . . ) from the flip-flop 21 of its stage, respectively. In addition, each of the flip-flops 21 receives the output signals X (X1, X2, . . . ) from the race hazard preventing circuit 22 which corresponds to a flip-flop 21 of the next stage, respectively. The output signal X from the next stage is used as the reset signal for that flip-flop 21.

The race hazard preventing section 203 prevents the shift register 201 from race hazard, even if a phase lag exists between the clock signal CK and the clock signal CKB. The existence of the phase lag creates a period where both the clock signal CK and the clock signal CKB to are High, overlappingly The race hazard preventing circuit 22 includes a phase difference detecting section 23 (23a, 23b) and a waveform timing shaping section 24 (24a, 24b).

The phase difference detecting section 23 generates an overlap-removed clock signal by removing an overlapping part of a waveform from the waveform of the clock signal (CK or CKB) which is to be inputted to the flip-flop 21 of the next stage. The overlapping part indicates a period where the waveforms of the clock signals CK and CKB overlap with each other. In the embodiment, the phase difference detecting section 23 detects the waveforms of the clock signal CK and the clock signal CKB, extracts the waveforms of the clock signal CK and the clock signal CKB where there is no overlapping period in the waveforms, and generates a new clock signal (overlap-removed clock signal) from the extracted waveforms.

The phase difference detecting section 23 generates different overlap-removed clock signals in the odd stages and the even stages. The phase difference detecting section 23a for the odd stages outputs output signals A1, A3, . . . as the overlap-removed clocked signal for the odd stages. The output signals A1, A3, . . . are signals in which a lagged part is removed from the clock signal CK (see FIG. 15). The lagged part indicates a part where both the clock signals CK and CKB are High. The phase difference detecting section 23b for the even stages outputs output signals A2, A4, . . . as the overlap-removed clock signal for even stages. The output signals A2, A4, . . . are signals in which the lagged part is removed from the clock signal CKB (see FIG. 15). The generation of new clock signals allows the output signals A1, A3, . . . and the output signals A2, A4, . . . to be signals that do not have the High periods overlapping with each other (see FIG. 15).

These phase difference detecting sections 23a and 23b may be formed from a NOR circuit NOR 1 and an inverter INV 1, as illustrated in FIG. 14. In this case, in the phase difference detecting section 23a of the odd stages, the clock signal CKB is directly inputted to the NOR circuit NOR 1, and the clock signal CK is inversely inputted via the inverter INV1. Thus, the NOR circuit NOR 1 outputs the High signal while the clock signal CK is High and the clock signal CKB is Low. This signal is outputted as the output signals A1, A3, (see FIG. 15).

The phase difference detecting section 23b of the even stages is opposite of that of the odd stages. Namely, the clock signal CK is directly inputted to the NOR circuit NOR 1, and the clock signal CKB is inversely inputted to the NOR circuit NOR 1 via the inverter INV 1. Thus, the NOR circuit NOR 1 outputs the High signal while the clock signal CK is Low and the clock signal CKB is High. This signal is outputted as the output signals A2, A4, . . . (see FIG. 15).

Consequently, as seen in FIG. 15, the output signals A1, A3, . . . and the output signals A2, A4, . . . include an interval between the High periods of each signal. The length of the interval is equivalent to the length of the lag occurred between the clock signals CK and CKB.

A waveform timing shaping section 24 generates output signals X (X1, X2, ...) by extracting a period where the output signals A (A1, A2, ...) is High, while the output signal Q (Q1, Q2, ...) of the corresponding flip-flop 21 is High. The output signals A are the overlap-removed clock signals generated in the phase difference detecting sections 23. The output signals X are outputted as the set signal for the following flip-flops 21, respectively. The arrangements of the waveform timing shaping section 24 of the odd stages and the even stages are the same.

In addition, the output signals X (X1, X2 ...) of each of the waveform timing shaping sections 24 is outputted as the output signal of the shift register 201. The output signal X of each of the waveform timing shaping sections 24 also is inputted to the flip-flop 21 of the preceding stage. The output signal inputted to the preceding flip-flop 21 is used as the reset signal, which resets the preceding flip-flop 21.

The waveform timing shaping section 24 may be formed including a NAND circuit NAND 1 and an inverter INV 2, as illustrated in FIG. 14. The NAND circuit NAND 1 receives the output signals A (A1, A2, A3, ...) from the corresponding phase difference detecting section 23, and receives the output signals Q (Q1, Q2, Q3, ...) from the corresponding flip-flop 21. An output signal from the NAND circuit NAND 1 is inverted via the inverter INV 2. The inverted output signal is outputted as the output signals X (X1, X2, ...). The NAND circuit NAND 1 has a Low output when both the output signals A and the output signals Q, each of which are to be inputted to the NAND circuit NAND 1, are in the High period. Because the output signal from the NAND circuit NAND 1 is inverted via the inverter INV 2, the waveform timing shaping section 24 outputs the High output signal X (X1, X2, ...) when both the output signals A and output signals Q are in the High period (see FIG. 15).

The following description deals with an operation of the shift register 201, with reference to a timing chart in FIG. 15. The flip-flop 21-1 of the first stage is set (a) when the start pulse SP is inputted thereto as the set signal. This changes the output signal Q1 to High.

In response to a High output signal Q1 from the flip-flop 21-1, the race hazard preventing circuit 22-1, which corresponds to the flip-flop 21-1 of the first stage, outputs an output signal X1. More precisely, the output signal X1 is outputted from the waveform timing shaping section 24 of the race hazard preventing circuit 22-1. The output signal X1 is High while an output signal A1 generated by the phase difference detecting section 23a in the race hazard preventing circuit 22-1 is High. The output signal X1 is outputted as the output of the first stage of the shift register 201.

The output signal X1 is inputted to the flip-flop 21-2 of the second stage as the set signal thereof. The flip-flop 21-2 of the second stage is set (b) in the timing the output signal X1 changes to High. This causes an output signal Q2 of the flip-flop 21-2 of the second stage to change to High, as similar to the above. In response to a High output signal Q2 of the flip-flop 21-2, the race hazard preventing circuit 22-2, which corresponds to the flip-flop 21-2 of the second stage, outputs an output signal X2. More precisely, the output signal X2 is outputted from the waveform timing shaping section 24b of the race hazard preventing circuit 22-2. The output signal X2 is High while an output signal A2 generated by the phase difference detecting section 23b in the race hazard preventing circuit 22-2 is High. The output signal X2 is outputted as the output of the second stage of the shift register 201.

The output signal X2 is inputted to the flip-flop 21-3 of the third stage as the set signal thereof, as similar to the above. The flip-flop 21-3 of the third stage is set (c) in the timing the output signal X2 changes to High. An output signal X3 which is High while the output signal A3 is High is outputted from the corresponding race hazard preventing circuit 22-3. The output signal X3 is outputted as the output of the third stage of the shift register 201. In addition, the output signal X2 is also inputted to the preceding flip-flop 21-1. The output signal X2 is used as a reset signal for that preceding flip-flop 21-1. That is, the output signal X2 is inputted to the flip-flop 21-1 of the first stage. Thus, the flip-flop 21-1 of the first stage is reset (e) in the timing the output signal X2 changes to High. This causes the output signal Q1 to change to Low.

The output signal X3 is inputted to a flip-flop 21-4 of the fourth stage as the set signal thereof, as similar to the above. Thus, the flip-flop 21-4 of the fourth stage is set (d) in the timing the output signal X3 changes to High. In addition, the output signal X3 is also inputted to the preceding flip-flop 21-2. The output signal X3 is used as a reset signal for that preceding flip-flop 21-2. That is, the output signal X3 is inputted to the flip-flop 21-2 of the second stage. Therefore, the flip-flop 21-2 of the second stage is reset (f) in the timing the output signal X3 changes to High.

The set/reset operation of the flip-flops 102 and the output operation of the output signals X (X1, X2, ...) by the race hazard preventing circuit 22, each successively operated in the stages of the shift register 201, enables the output of the output signals X (X1, X2, ...) which do not overlap with each other from the shift register 201. Specifically, the output signals X which do not overlap with each other are outputted as a result of the following process. The output signals X1, X3, ... are outputted from the odd stages of the shift register 201. The output signals X1, X3, ... use the High periods of the output signals A1, A3, .... The output signals A1, A3, ... are overlap-removed clock signals for the odd stages. On the other hand, the output signals X2, X4, ... are outputted from the even stages of the shift register 201. The output signals X2, X4, ... use the High periods of the output signals A2, A4, .... The output signals A2, A4, ... are overlap-removed clock signals for the even stages in which the High period thereof do not overlap with the High period of the output signals A1, A3, ....

As such, the shift register 201 can properly operate having no race hazard occurring by using the output signals X (X1, X2, ...) as the set signal for the flip-flop 21 of the next stage, even if a phase lag occurs in the clock signals CK and CKB.

Patent Document 1
Japanese Unexamined Patent Publication, Tokukai, No. 2005-222655 (published on Aug. 18, 2005))

Patent Document 2
Japanese Unexamined Patent Publication, Tokukai, No. 2004-126551 (published on Apr. 22, 2004)

Patent Document 3
Patent No. 3536657 (registered on Mar. 26, 2004, Japanese Unexamined Patent Publication, Tokukaihei, No, 11-282397 (published on Oct. 15, 1999))

Patent Document 4
Japanese Unexamined Patent Publication, Tokukaihei, No. 5-2889 (published on Jan. 8, 1993)

DISCLOSURE OF INVENTION

The shift register 201 in Patent Document 1 uses a transistor circuit of a CMOS structure for the race hazard preventing circuit 22 of the race hazard preventing section 203. In the CMOS structure, a through current temporarily flows between the voltage sources when the level of the input signal changes. For example, assume that a CMOS inverter as illustrated in FIG. 16(a) receives an input signal as illustrated in FIG. 16(b). When the input signal changes from Low to High as circled in FIG. 16(b), a pMOS transistor 211 attempts to change from ON to OFF, and an nMOS transistor 212 attempts to change from OFF to ON. However, during this change of signal level, a range exists where both the pMOS transistor 211 and the nMOS transistor 212 are ON. In this range, a spike-shaped through current flows from the voltage source VDD towards the voltage source VSS, as illustrated in FIG. 16(c). The similar through current flows when the input signal changes from High to Low. Specifically, the through current flows each time a conduction switching operation is performed between the path for High output including the pMOS transistor and the path for Low output including the nMOS transistor.

The flowing of the through current causes a problem of the increase in power consumption by the circuit which includes the through current generating part, regardless of the race hazard preventing circuit 22. In addition, the flowing of the through current causes another problem that a high frequency noise generates in the power source line. Recent liquid crystal panels have become high-definition due to the increase in pixels. Effected by this, the number of flip-flop stages which are included in the shift register tends to proportionally increase. Therefore, the amount of parts in which the through current is generated also increases. This causes the problem of the through current to be of a large issue. Particularly, the through current frequently flows in the case of the race hazard preventing circuit 22. This is because the output signals A1, A2, . . . changes its level between High and Low in the cycle of the clock signals CK and CKB, even during the period where the High period of the output signals X1, X2, . . . is not generated. That is, the output signals A1, A2, . . . changes its level even during the Low period (inactive period) of the output signals Q1, Q2, . . . . Therefore, the increase in power consumption by the shift register 201 which includes the race hazard preventing circuit 22 is extremely great, and high frequency noise is generated extremely frequently.

The present invention is made in consideration of the aforementioned problems, and an object thereof is to realize a driving circuit which enables to suppress an increase in power consumption and to suppress high frequency noise generation, each of which is caused by a through current, while preventing race hazard of a shift register, for a driving circuit of a display device which (i) generates in each stage, by an operation using a combination of an output signal of a flip-flop, and a first clock signal and a second clock signal, an input signal for a flip-flop of a next stage; and (ii) generates in each stage, as an drive signal of the display panel, an output signal of a shift register from the output signal of the flip-flop. Another object thereof is to realize a display device which includes the driving circuit, and a driving method for the display device.

In order to solve the problems, a driving circuit of the present invention is a driving circuit including a shift register which includes stages, each of which includes a flip-flop, each of the stages generating an input signal for the next flip-flop by an MOS type logical operation which uses an output signal of the flip-flop and at least one of a first clock signal and a second clock signal, and each of the stages generating, from the output signal of the flip-flop, an output signal of the shift register as a drive signal of a display panel, wherein: based on an input of the output signal of the flip-flop to a logical operation circuit, the logical operation circuit performs the logical operation in such a manner that a conduction switching operation between a plurality of logical derivation paths which have different power source voltages used in deriving logic is hindered in each of logical derivation stages inside the logical operation circuit while the output signal of the flip-flop is inactive, the conduction switching operation occurring with accordance to a periodic level change of at least one of the first clock signal and the second clock signal.

In addition, in order to solve the problems, a driving method of the present invention for a display device is a driving method for a display device including a driving circuit, the driving circuit including: a shift register which includes stages, each of which includes a flip-flop, each of the stages generating an input signal for the next flip-flop by an MOS type logical operation which uses an output signal of the flip-flop and at least one of a first clock signal and a second clock signal, and each of the stages generating, from the output signal of the flip-flop, an output signal of the shift register as a drive signal of a display panel wherein: based on an input of the output signal of the flip-flop to a logical operation circuit, the logical operation circuit performing the logical operation in such a manner that a conduction switching operation between a plurality of logical derivation paths which have different power source voltages used in deriving logic is hindered in each of logical derivation stages inside the logical operation circuit while the output signal of the flip-flop is inactive, the conduction switching operation occurring with accordance to a periodic level change of at least one of the first clock signal and the second clock signal.

In the present application, a flip-flop is defined as a circuit and an element which temporarily latches data.

According to the invention, when an output signal of a flip-flop is inactive, the input of the output signal of the flip-flop to a logical operation circuit which performs a logical operation of a MOS type causes each of a logical derivation stage of the logical operation circuit to hinder a conduction switching operation between a plurality of logical derivation paths which have different power source voltages used in deriving logic. The conduction switching operation occurs corresponding to periodic level change of a first clock signal or a second clock signal.

Therefore, a through current does not flow in each logical derivation stage of the MOS type logical operation circuit, while the output signal of the flip-flop is inactive. The through current is a current which flows by being effected by a plurality of logical derivation paths which are conductive at the same time in accordance with the periodic level change of the first clock signal and the second clock signal. If the logical operation circuit is used for preventing the race hazard of the shift register, the overlapping of the input signals of the flip-flops between stages can be prevented, even if the first clock signal and the second clock signal have the same High and Low period lengths, and the phases are lagged in the values by a half-cycle.

As from the above, the present invention enables to suppress the increase in power consumption and generation of high frequency noise, each of which is caused by the through current, while preventing the race hazard of the shift register.

For a fuller understanding of the nature and advantages of the invention, reference should be made to the ensuing detailed description taken in conjunction with the accompanying drawings.

BRIEF DESCRIPTION OF DRAWINGS

FIG. 3 is a circuit diagram schematically illustrating a first exemplary structure of a NAND circuit which is included in the shift register of FIG. 1.

In FIG. 4, (a) is a circuit diagram schematically illustrating a second exemplary structure of a NAND circuit which is included in the shift register of FIG. 1, and (b) is a waveform chart explaining the High and Low of a clock signal.

FIG. 5 is a circuit diagram schematically illustrating a third exemplary structure of a NAND circuit which is included in the shift register of FIG. 1.

In FIG. 6, (a) through (c) are timing charts explaining race hazard of a shift register caused by a rising and decaying exponential of a waveform of a clock signal.

FIG. 14 illustrates a conventional art, and is a circuit block diagram schematically illustrating an essential part of another shift register.

In FIG. 16, (a) through (c) are views explaining a through current.

EXPLANATION OF REFERENCE NUMERALS

Figure 1:
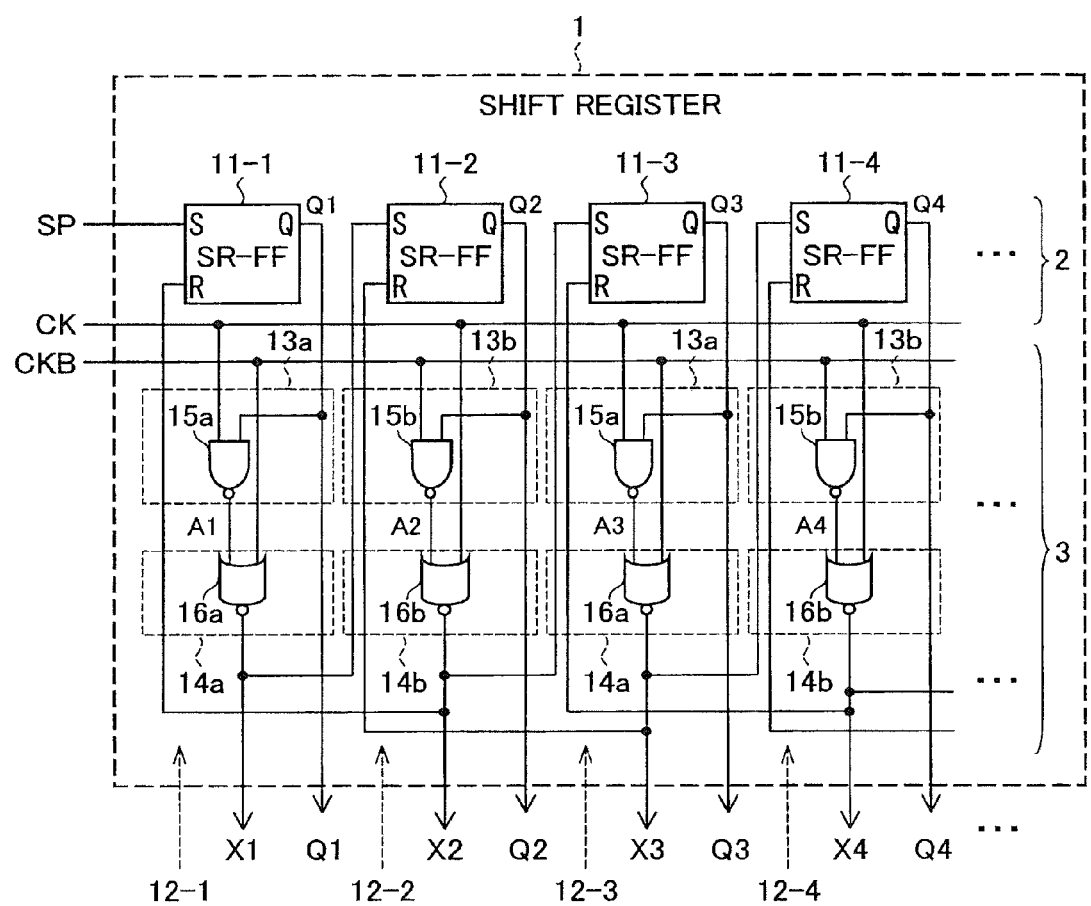
FIG. 1 illustrates First Embodiment of the present invention, and is a circuit block diagram schematically illustrating an essential part of a shift register.

1 Shift register (driving circuit)
2 Flip-flop section
3 Race hazard preventing section
11 Flip-flop
12 Race hazard preventing circuit
15a, 15b NAND circuit
16a, 16b NOR circuit
X Output signal (output signal of the shift register, input signal for the next flip-flop)
Q Output signal (output signal of flip-flop, output signal of shift register)
Qd Delay signal
Qno (FIG. 8)
    Output signal (output signal of flip-flop)
QBd Delay signal
Qno (FIG. 10)
    Intermediate signal (output signal of flip-flop)

BEST MODE FOR CARRYING OUT THE INVENTION

The following description further deals with the present invention with reference to embodiments and comparative examples. However, the present invention is not limited to these.

First Embodiment

One embodiment of the present invention is described below with reference to FIGS. 1 through 5.

FIG. 1 illustrates an arrangement of a shift register 1 pertaining to the present embodiment. In the embodiment, it is assumed that a display data is inputted to a display panel such as a liquid crystal panel, by using the shift register 1. The shift register 1 is connected to a level shifter, an analog switch, and other components. The level shifter performs level shifting of an output signal, and the analog switch is driven by an output signal of the level shifter. The driving circuit of the display device which includes the display panel may indicate a driving circuit which is solely made from the level shifter 1, or may indicate the whole of the driving circuit including the other circuits such as the level shifter and the analog switch to be connected to the level shifter 1.

The stage numerals of the shift register 1 are consecutively 1, 2, 3, . . . from the first stage, illustrated as the leftmost in FIG. 1. The −1, −2, −3, . . . that are added to the end of the member numerals indicate the stage numeral in which the member belongs.

The shift register 1 includes a flip-flop section 2 and a race hazard preventing section 3. The flip-flop section 2 has a set/reset type flip-flop 11 (11-1, 11-2, . . . ) on each stage. The race hazard preventing section 3 has a race hazard preventing circuit 12 (12-1, 12-2, . . . ) on each stage. Specifically, each of the stages in the shift register 1 has the set/reset type flip-flop (hereafter referred as simply 'flip-flop') 11, and corresponding to each of the flip-flops 11, one race hazard preventing circuit 12 (12-1, 12-2, . . . ) which receives the output signal Q (Q1, Q2, . . . ) from the flip-flop 11 is provided per stage. The shift register 1 is arranged so that it receives a start pulse SP and two clock signals CK and CKB. The two clock signals CK and CKB have different phases to each other.

The flip-flop 11-1, illustrated as the leftmost stage in FIG. 1, which is in the first stage of the flip-flop section 2, receives the start pulse SP. In response to the input of the start pulse SP to the flip-flop 11-1, the flip-flop section 2 outputs output signals Q (Q1, Q2, . . . ) from the flip-flops 11 sequentially in order from the flip-flop 11 on the leftmost stage.

The flip-flop 11 of the set/reset type is set by receiving an active set signal at an S terminal thereof (High in the embodiment). As a result, an output signal Q (Q1, Q2, . . . ) outputted from a Q terminal is changed to High. The High output state is continuously maintained even if the set signal becomes inactive (Low in the embodiment). The flip-flop resets itself when an R terminal thereof receives an active reset signal (High in the embodiment). This changes the output signal Q to Low. This Low output state is continuously maintained until the next active set signal is received, even if the reset signal becomes inactive (Low in the embodiment).

Of each of the flip-flops 11, the flip-flop 11-1 receives the start pulse SP as the set signal. The flip-flop 11-1 is in the first stage of the shift register 1, and illustrated as the leftmost stage in FIG. 1. Each of the flip-flops 11 following the flip-flop 11-1 receive an output signal X (X1, X2, . . . ) from the race hazard preventing circuit 12 preceding that flip-flop 11, respectively. The output signal X from the preceding stage is used as the set signal for that flip-flop 11. Each of the race hazard preventing circuits 12 in each stage generates the output signals X (X1, X2, . . . ) respectively, by using the output signals Q (Q1, Q2, . . . ) from the flip-flop 11 on its same stage, the clock signal (first clock signal) CK, and the clock signal (second clock signal) CKB.

The clock signal CK and the clock signal CKB have an equal High and Low period length. A lag exists between the phases of the two clock signals, in which the phase of the clock signal CKB is delayed from the clock signal CK by half a cycle, or by a value greater than half the cycle however less than a whole cycle. As an output signal of the shift register 1, the output signals X (X1, X2, . . . ) or the output signals Q (Q1, Q2, . . . ) is used. If the output signals X (X1, X2, . . . ) is used as the output signals of the shift register 1, the output signals X (X1, X2, . . . ) which are the set signals for the flip-flops 11 of the next stage will also function as the output signal of the shift register 1. There is no need to create a separate input signal for the flip-flop 11 of the next stage other than the output signal of the shift register 1, if the output signals X function as the set signal for the flip-flop 11 of the next stage.

In addition, each of the flip-flops 11 receives the output signals X (X2, X3, . . . ) from the race hazard preventing circuit 12 of the next stage, respectively. The output signal X is used as the reset signal for that flip-flop 11.

Figure 2:
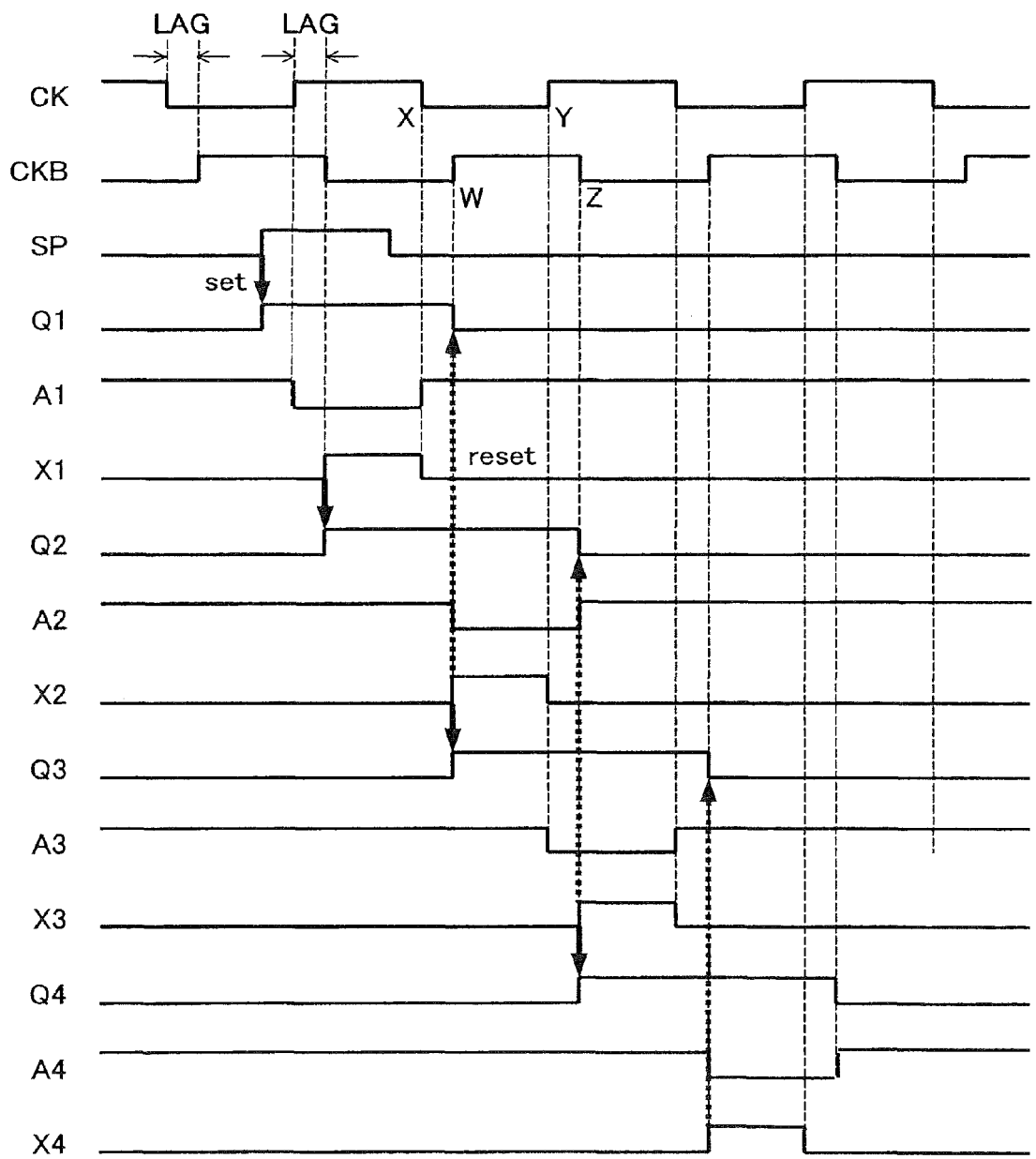
FIG. 2 is a timing chart explaining operation of the shift register of FIG. 1.

The race hazard preventing section 3 prevents race hazard of the shift register 1 by avoiding overlapping of the pulse periods of the output signals X1, X2, . . . even if, due to a phase lag provided between the clock signal CK and the clock signal CKB, there is a period where both the clock signal CK and the clock signal CKB are High, or both the clock signal CK and the clock signal CKB are Low, as illustrated in FIG. 2. Note that the 'lag' in FIG. 2 indicates a further phase lag from the phase lag by half the cycle. In order to prevent the race hazard, each of the race hazard preventing circuits 12 of the race hazard preventing section 3 generates an output signal X (X1, X2, . . . ) by an MOS type logical operation, by using the output signal Q (Q1, Q2, . . . ) of the flip-flop 11 of the same stage as each of the race hazard prevention circuit 12, the clock signal CK and the clock signal CKB. Furthermore, it is possible for each of the logical derivation stages of the logical operation circuit which perform the logical operation to perform a conduction switching operation between the logical derivation path for High output and the logical derivation path for Low output, when the output signals Q (Q1, Q2, . . . ) which is inputted to each of the logical derivation stages is active (High in the embodiment). The conduction switching operation is performed with accordance to the periodic level change such as the change of the clock signals CK and CKB from High to Low or from Low to High. However, when the output signals Q (Q1, Q2, . . . ) which is inputted to the logical derivation stages is inactive (Low in the embodiment), the conduction switching operation is hindered.

When "the output signal Q of the flip-flop 11 is active", the flip-flop 11 enters a period in which the flip-flop 11 is involved in activating the output signals (X and Q) to be outputted from its own stage as the output signals (X and Q) of the shift register 1, and that the flip-flop 11 enters a period in which the flip-flop 11 is involved in passing a pulse to the flip-flop 11 of its next stage.

The race hazard preventing circuit 12 includes a clock pulse extracting section 13 (13a, 13b) and a waveform timing shaping section 14 (14a, 14b).

The clock pulse extracting sections 13 extract one pulse from a waveform of the clock signal CK or the clock signal CKB. This extracted pulse is outputted as a pulse of a predetermined polarity. The signal which includes the outputted pulse is indicated as output signals A (A1, A2, . . . ).

The clock pulse extracting sections 13a of the odd stages (i) extract one pulse from the clock signal CK, (ii) generate the output signals A1, A3, . . . from the extracted pulse, and (iii) output these output signals A1, A3, . . . . The clock pulse extracting sections 13b of the even stages (i) extract one pulse from the clock signal CKB, (ii) generate the output signals A2, A4, . . . from the extracted pulse, and (iii) output these output signals A2, A4, . . . (see FIG. 2).

In order to perform these operations, the clock pulse extracting sections 13a of the odd stages include a NAND circuit 15a, and the clock pulse extracting sections 13b of the even stages include a NAND circuit 15b. The NAND circuit 15a has two inputs, where one input terminal receives the clock signal CK, and the other input terminal receives the output signal Q (Q1, Q3, . . . ) of the flip-flop 11 of the same stage as that clock pulse extracting section 13a. The NAND circuit 15b has two inputs, where one input terminal receives the clock signal CKB, and the other input terminal receives the output signal Q (Q1, Q3, . . . ) of the flip-flop 11 of the same stage as that clock pulse extracting section 13b. In the present embodiment, the NAND operation which is performed by the NAND circuit 15a is indicated as the first NAND operation, and the NAND operation which is performed by the NAND circuit 15b is indicated as the second NAND operation.

The waveform timing shaping sections 14a of the odd stages generate and output signals X1, X3, . . . (see FIG. 2). The output signals X1, X3, . . . are signals in which (i) an overlapping period is removed from the pulse of the output signals A1, A3, . . . of the clock pulse extracting section 13a, from the start timing side of the pulse and (ii) the level of the output signals A1, A3, . . . of which the overlapping period is removed is inverted. The waveform timing shaping sections 14b of the even stages generate and output signals X2, X4, . . . . The output signals X2, X4, . . . are signals in which (i) the overlapping period is removed from the pulse of the output signals A2, A4, . . . of the clock pulse extracting section 13b, from the end timing side of the pulse; and (ii) the level of the output signals A2, A4, . . . which the overlapping period is removed is inverted. The overlapping period indicates a period where the clock signal CK and the clock signal CKB are both High.

In order to perform these operations, the waveform timing shaping sections 14a of the odd stages include a NOR circuit 16a, and the waveform timing shaping sections 14b of the even stages include a NOR circuit 16b. The NOR circuit 16a has two inputs, where one input terminal receives the output signals A (A1, A3, . . . ) of the same stage as that waveform timing shaping section 14a. That is, one input terminal of the NOR circuit 16a receives the result of the first NAND operation. The other input terminal of the NOR circuit 16a receives the clock signal CKB. The NOR circuit 16b has two inputs, where one input terminal receives the output signals A (A2, A4, and on) of the same stage as that waveform timing shaping section 14b. That is, one terminal of the NOR circuit 16b receives the result of the second NAND operation. The other input terminal of the NOR circuit 16b receives the clock signal CK. In the present embodiment, a NOR operation which is performed by the NOR circuit 16a is indicated as a first NOR operation, and a NOR operation which is performed by the NOR circuit 16b is indicated as a second NOR operation.

The following description deals with the operation of the shift register 1 in the above arrangement with reference to FIG. 2.

As illustrated in FIG. 2, the start pulse signal SP is received by the flip-flop 11-1. The output signal Q1 of the flip-flop 11-1 changes to High (active) in the timing the start pulse signal SP changes to High. The output signal Q1 continues to stay High until the output signal X2 of the next step changes to High, and is inputted to the R terminal of the flip-flop 11-1. The output signal Q1 and the clock signal CK are inputted to the NAND circuit 15a. The NAND circuit 15a is included in the clock pulse extracting section 13a of the race hazard preventing circuit 12-1. Consequently, the first NAND operation extracts one pulse of the clock signal CK included in the High period of the output signal Q1 and inverts the phase of the extracted pulse. As a result, an output signal A1 which has a pulse that is Low during a High period of the extracted clock signal CK is outputted from the NAND circuit 15a.

Furthermore, the output signal A1 and the clock signal CKB are inputted to the NOR circuit 16a. The NOR circuit 16a is included in the waveform timing shaping section 14a of the race hazard preventing circuit 12-1. The NOR circuit 16a generates the output signal X1 by the first NOR operation. The output signal X1 is a signal in which (i) the overlapping period is removed from the pulse period (Low period) of the output signal A1; and (ii) the level of the output signal A1 which the overlapping period is removed is inverted. The overlapping period indicates a period where both the clock signal CK and the clock signal CKB are High. The output signal X1 functions as the set signal for the flip-flop 11-2 of the next stage. The output signal X1 can be concurrently used as the output signal of the shift register 1.

The output signal Q2 of the flip-flop 11-2 changes to High (active) in the timing the output signal X1 from the preceding stage changes to High. The output signal Q2 continues to stay High until the output signal X3 of its next stage changes to High, and is inputted to the R terminal of the flip-flop 11-2. The output signal Q2 and the clock signal CKB are inputted to the NAND circuit 15b. The NAND circuit 15b is included in the clock pulse extracting section 13b of the race hazard preventing circuit 12-2. Consequently, the second NAND operation extracts one pulse of the clock signal CKB included in the High period of the output signal Q2 and inverts the phase of the extracted pulse. As a result, the output signal A2 which has a pulse that is Low during the High period of the extracted clock signal CKB is outputted from the NAND circuit 15b.

Furthermore, the output signal A2 and the clock signal CKB are inputted to the NOR circuit 16b. The NOR circuit 16b is included in the waveform timing shaping section 14b of the race hazard preventing circuit 12-2. The NOR circuit 16b generates an output signal X2 by the second NOR operation. The output signal X2 is a signal in which (i) the overlapping period is removed from the pulse period (Low period) of the output signal A2; and (ii) the level of the output signal A2 which the overlapping period is removed is inverted. The overlapping period indicates a period where both the clock signal CK and the clock signal CKB are High. The output signal X2 functions as the set signal for the flip-flop 11-3 of the next stage. The output signal X2 can be concurrently used as the output signal of the shift register 1.

A rise of the output signal X2 to High is synchronized with a rise of the clock signal CKB extracted by the clock pulse extracting section 13b to High (W in drawing). Therefore, the input of the output signal X2 to the R terminal of the flip-flop 11-1 causes the output signal Q1 of the flip-flop 11-1 to fall Low following the fall of the clock signal CK to Low (X in drawing). This clock signal is what the clock pulse extracting section 13a of the race hazard preventing section 12-1 attempts to extract. Thus, the High period of the output signal Q1 has a length including one whole pulse of the clock signal CK to be extracted. Thus, as the aforementioned, the clock pulse extracting section 13a of the race hazard preventing circuit 12-1 can extract one whole pulse of the clock signal CK, and generate the output signal A1 including a pulse which has an equal pulse width with the extracted clock signal CK.

The output signal Q3 of the flip-flop 11-3 changes to High (active) in the timing the output signal X2 preceding the flip-flop 11-3 changes to High. The output signal Q3 continues to stay High until the output signal X4 of the next stage changes to High, and is inputted to the R terminal of the flip-flop 11-3. The output signal Q3 and the clock signal CK are inputted to the NAND circuit 15a. The NAND circuit 15a is included in the clock pulse extracting section 13a of the race hazard preventing circuit 12-3. Consequently, the first NAND operation extracts one pulse of the clock signal CK included in the High period of the output signal Q3 and inverts the phase of the extracted pulse. As a result, the output signal A3 which has a pulse that is Low during the High period of the extracted clock signal CK is outputted from the NAND circuit 15a.

Furthermore, the output signal A3 and the clock signal CKB are inputted to the NOR circuit 16a. The NOR circuit 16a is included in the waveform timing shaping section 14a of the race hazard preventing circuit 12-3. The NOR circuit 16a generates an output signal X3 by the first NOR operation. The output signal X3 is a signal in which (i) the overlapping period is removed from the pulse period (Low period) of the output signal A3; and (ii) the level of the output signal A3 of which the overlapping period is removed is inverted. The overlapping period indicates a period where the both the clock signal CK and the clock signal CKB are High. The output signal X3 functions as the set signal for the flip-flop 11-4 of the next stage. The output signal X3 can be concurrently used as the output signal of the shift register 1.

A rise of the output signal X3 to High is synchronized with a fall of the clock signal CKB (Z in drawing) which follows a rise of the clock signal CK extracted by the clock pulse extracting section 13a to High (Y in drawing). Therefore, the input of the output signal X3 to the R terminal of the flip-flop 11-2 causes the fall of the output signal Q2 of the flip-flop 11-1 to Low synchronize with the fall of the clock signal CKB to Low (Z in drawing). This clock signal CKB is what the clock pulse extracting section 13b of the race hazard preventing section 12-2 attempts to extract. Thus, the High period of the output signal Q2 has a length including one whole pulse of the clock signal CKB to be extracted. Thus, as the aforementioned, the clock pulse extracting section 13b of the race hazard preventing circuit 12-2 can extract one whole pulse of the clock signal CKB, and generate the output signal A2 including a pulse which has an equal pulse width to the extracted clock signal CKB.

As similar to the above, the output signals X4, X5, ... are generated. Thus, a space is provided between the output signals X in consecutive stages, for the period equivalent to the period in which the clock signal CK and the clock signal CKB are both High, that is, the period equivalent to the period in which both signals are Low. Therefore, there will be no case where a plurality of output signals X1, X2 ... are High at the same time, of the output signals X1, X2, .... This specifically indicates that the race hazard of the shift register 1 can be prevented, even if the clock signal CK and the clock signal CKB have a lag by the half-cycle. In other words, the race hazard of the shift register is prevented even if the phase of the clock signal CKB is delayed from the clock signal CK greater than the half-cycle however smaller than one cycle. If the phase of the clock signal CK and the clock signal CKB is lagged by the half-cycle, the space between the consecutive output signals X will be 0. Of course, in this case, the shift register 1 performs normal operation.

In case the output signal X is used as the output signal of the shift register 1, each of the source signal lines can be charged one each even if the charging period is not overlapped with each other, by equipping the shift register 1 in the source driver of the liquid crystal panel. In addition, if the shift register 1 is equipped in the gate driver of the liquid crystal panel, successive scanning of each of the gate signal lines can be performed.

It is possible to use the output signals Q (Q1, Q2, . . . ) as the output signal of the shift register 1. However, for the stages following the first stage, it is the rise timing of the output signals X to High that determines the reset timing of the flip-flop 11 preceding that stage. The rise timing of the output signals X also determines the set timing for the flip-flops 11 following the flip-flop 11-1. Therefore, the High periods of an output signal Q will not overlap with the High period of the output signal Q of the two latter stages. Thus, including the shift register 1 in the source driver of the liquid crystal panel enables the use of the output signal Q as a so-called 'double duration pulse'. The 'double duration pulse' has a pulse width of substantially one period of the clock signal CK or CKB. As a result, it is possible to secure sufficient charging time for each source signal line.

The following description deals with the NAND circuits 15a and 15b.

FIG. 3 illustrates a first arrangement of the NAND circuits 15a and 15b. The NAND circuits include MOS transistors 31 through 34. The MOS transistors 31 and 33 are of a p-channel type, and the MOS transistors 32 and 34 are of an n-channel type. In addition, of the two voltage sources to be used in logical operation of the race hazard preventing circuit 12 which includes one of either the NAND circuit 15a or 15b, one voltage source on the High side is the voltage source VDD, and the other voltage source on the Low side is the voltage source VSS.

The source of the MOS transistor 31 is connected to the voltage source VDD, and the drain of the MOS transistor 31 is connected to the drain of the MOS transistor 32. The source of the MOS transistor 33 is connected to the voltage source VDD, and the drain of the MOS transistor 33 is connected to the drain of the MOS transistor 32. The source of the MOS transistor 32 is connected to the MOS transistor 34 of the MOS transistor 34. The source of the MOS transistor 34 is connected to the voltage source VSS. Specifically, the MOS transistors 31 and 33 are connected in parallel, and the MOS transistors 32 and 34 are connected in series. The parallel circuit and the transverse circuit are connected in series.

The gate of the MOS transistor 31 and the gate of the MOS transistor 32 function as an input terminal of the clock signals CK and CKB. Specifically, the gate of the MOS transistor 31 and the gate of the MOS transistor 32 function as one of the input terminals of the NAND circuits 15a and 15b. The gate of the MOS transistor 33 and the gate of the MOS transistor 34 function as an input terminal of the output signal Q. Specifically, the gate of the MOS transistor 33 and the gate of the MOS transistor 34 function as the other input terminal of the NAND circuits 15a and 15b. In addition, the drains of the MOS transistors 31 through 33 function as the output terminal OUT of the NAND circuits 15a and 15b.

The NAND circuits 15a and 15b in this arrangement outputs High from the output terminal OUT when at least one of the following occurs: (i) the MOS transistor 31 turns ON; and (ii) the MOS transistor 33 turns ON. When both MOS transistors 32 and 34 turn ON, the NAND circuits 15a and 15b output Low from the output terminal OUT. A path from the voltage source VDD to the output terminal OUT via the MOS transistor 31 is indicated as a path for voltage output of the voltage source VDD, that is, a logical derivation path BH1 for High output. A path from the voltage source VDD to the output terminal OUT via the MOS transistor 33 is a path for voltage output of the voltage source VDD, that is, a logical derivation path BH2 for High output. A path from the voltage source VSS to the output terminal OUT via the MOS transistors 32 and 34 is a path for voltage output of the voltage source VSS, that is, a logical derivation path BL1 for Low output.

The logical derivation paths BH1, BH2 and BL1 form one logical derivation stage in this arrangement, which derives a High or Low logic to the output terminal OUT. The present embodiment does not arrange an independent IC for each of the NAND circuits 15a and 15b, however since the circuit connected to the latter stage of the output terminal OUT can be regarded as a load for the logical derivation stage, the logical derivation paths BH1 and BH2 are regarded as source current paths flowing current towards the output terminal OUT from the voltage source VDD, and the logical derivation path BL1 is regarded as a sink current path flowing current towards the voltage source VSS from the output terminal OUT. The output terminal OUT is a logic output terminal of the logical derivation stage. A source current and a sink current in this case flow immediately after the switching of the derived logic.

In the NAND circuits 15a and 15b of the above arrangement, the MOS transistor 33 turns OFF and the MOS transistor 34 turns ON while the output signal Q is High (active). Consequently, the logical derivation path BH2 is blocked. Therefore, when the inputted clock signal CK or CKB is High, the MOS transistor 31 turns OFF which blocks the logical derivation path BH1, while the MOS transistor 32 turns ON which conducts the logical derivation path BL1. This allows the Low signal to be outputted from the output terminal OUT. That is to say, the output signal A is Low. On the other hand, when the received clock signal CK or CKB is Low, the MOS transistor 31 turns ON which conducts the logical derivation path BH1, while the MOS transistor 32 turns OFF which blocks the logical derivation path BL1. This allows the High signal to be outputted from the output terminal OUT. That is to say, the output signal A is High.

As such, a High (active) output signal Q enables the logical derivation path BH1 for High output and the logical derivation path BL1 for Low output to perform conduction switching operation therebetween, with accordance to the level change in the clock signal CK or CKB to be received. In consequence, when the output signal Q is High (active), a through current may flow from the voltage source VDD to the voltage source VSS effected by the conduction switching operation.

A Low (inactive) output signal Q turns ON the MOS transistor 33, and turns OFF the MOS transistor 34. This allows current flow through the logical derivation path BH2, and blocks the logical derivation path BL1. Consequently, when the received clock signal CK or CKB is High, the MOS transistor 31 and 32 both turn OFF, which blocks the logical derivation path BH1. As a result, the High is outputted from the output terminal OUT. That is to say, the output signal A is High. On the other hand, when the received clock signal CK or CKB is Low, the MOS transistor 31 turns ON which conducts the logical derivation path BH1, and the MOS transistor 32 turns OFF, in which the High is outputted from the output terminal OUT. That is to say, the output signal A is High.

As such, when the output signal Q is Low (inactive), the logical derivation path BL1 stays blocked even if the clock signals CK and CKB change in level, and just the logical derivation path BH2 allows current flow through, or just both the logical derivation paths BH1 and BH2 allows current to flow through. Therefore, the conduction switching operation between a plurality of logical derivation paths, each with different power source voltages used in deriving logic is blocked, for example between the logical derivation path BH1 for High output and the logical derivation path BL1 for Low output, or between the logical derivation path BH2 for High output and the logical derivation path BL1 for Low output. Thus, when the output signal Q is Low (inactive), current would not flow through the logical derivation path for High output BH1 or BH2 and the logical derivation path BL1 for Low output at the same time in accordance with the periodic level change of the clock signals CK and CKB. Therefore, the through current from the voltage source VDD to the voltage source VSS does not flow.

As illustrated in FIG. 2, the above description is equivalent to: (i) the level of the output signals A of the NAND circuits 15a and 15b changes while the output signals Q is active, and (ii) the High output state of the output signals A is maintained and the level change does not occur while the output signals Q is inactive, except for the level change occurring in the output signals Q of the even stages between active and inactive. Effected by this, in the NOR circuit which receives the output signals A, the output signals A fixes the output signals X of the NOR circuit 16a and 16b while the output signals Q is inactive. Therefore, inside the NOR circuits 16a and 16b, the conduction switching operation between the logical conduction path for High output and the logical conduction path for Low output in the logical derivation stage is blocked. Consequently, while the output signals Q is inactive, the logical derivation path for High output and the logical derivation path for Low output no longer conduct at the same time with accordance to the periodic level change of the clock signals CK and CKB in the NOR circuits 16a and 16b. As a result, the through current does not flow in the NOR circuit 16a or 16b.

The logical derivation stage is not limited to the aforementioned. If a circuit stage to be provided in the middle of a gate circuit to derive and transmit a logic such as a CMOS inverter to the latter stage exists in a logic gate such as the NAND circuit or the NOR circuit, this circuit stage is also included in the logical derivation stage. The CMOS inverter as an independent logic gate may also be included in the logical derivation stage.

As such, the period in which the through current may flow is limited in the present embodiment. As a result of suppressing the through current, it is possible to suppress the increase in power consumption and the occurrence of high frequency noise, each caused by the through current.

A second arrangement of the NAND circuits 15a and 15b is illustrated in FIG. 4(a). The NAND circuits include MOS transistors 41 and 42. The MOS transistor 41 is of a p-channel type, and the MOS transistor 42 is of an n-channel type. In addition, one of the two power sources is a voltage source VDD, and the other power source is a clock source line of the clock signal CK or CKB. In this arrangement, in the odd stages, the clock source line inputs the clock signal CKB as the clock signal, not the clock signal CK. Thus, the NAND operation result of the odd stages is derived from the clock signal CK and the output signal Q. In contrast, in the even stages, the clock source line inputs the clock signal CK as the clock signal, not the clock signal CKB. Thus, the NAND operation result of the even stages is derived from the clock signal CKB and the output signal Q.

The source of the MOS transistor 41 is connected to the voltage source VDD, and the drain of the MOC transistor 41 is connected to the drain of the MOS transistor 42. The source of the MOS transistor 42 is the input terminal of the clock signals CK and CKB. Namely, the source of the MOS transistor 42 functions as one of the input terminals of the NAND circuits 15a and 15b. In addition, the gate of the MOS transistor 41 and the gate of the MOS transistor 42 function as the input terminal of the output signal Q. Namely, the gates of the MOS transistors 41 and 42 function as the other input terminal of the NAND circuits 15a and 15b.

FIG. 4(b) illustrates levels of the clock signals CK and CKB. In the embodiment, the clock signals CK and CKB are set to have a Low level VSS, and a High level VDD-Vz. The Vz is to be a voltage equal to or higher than a threshold voltage of the MOS transistor 42, in order for the MOS transistor 42 to turn ON when the output signal Q is high.

In the NAND circuits 15a and 15b of this arrangement, a High signal is outputted to the output terminal OUT when the MOS transistor 41 is ON, and the voltage of the inputted clock signals CK and CKB is outputted to the output terminal OUT when the MOS transistor 42 is ON. A path from the voltage source VDD to the output terminal OUT via the transistor 41 is indicated as a logical derivation path B1, and a path from the input terminal of the clock signals CK and CKB to the output terminal OUT via the transistor 42 is indicated as a logical derivation path B2. In case of this arrangement, the logical derivation path B1 and the logical derivation path B2 form one logical derivation stage, which derives the High or Low logic to the output terminal OUT. A circuit to be connected to the latter stage of the output terminal OUT may be considered as a load of the logical derivation stage.

The logical derivation path B1 is the path which outputs the voltage of the voltage source VDD. Therefore, the logical derivation path B1 is a logical derivation path for High output. Consequently, the logical derivation path B1 is a source current path which flows current towards the output terminal OUT from the voltage source VDD. The logical derivation path B2 functions as a sink current path when the logical derivation path B2 conducts in the timing the logical derivation path B1 switches from conduction state to blocking state. The sink current path flows current towards the input terminal of the clock signals CK and CKB from the output terminal OUT. Subsequently, the logical derivation path switches to a sink current path when the clock signals CK and CKB switch from High to Low, and to a source current path when the clock signals CK and CKB switch from Low to High. The source current path flows current towards the output terminal OUT from the input terminal of the clock signals CK and CKB. A source current and a sink current in this case flows immediately after the switching of the derived logic.

In the NAND circuits 15a and 15b of the above arrangement, the MOS transistor 41 turns OFF when the output signals Q is High (active). This blocks the logic derivation path B1. At the same time, the MOS transistor 42 turns ON. This allows current flow through the logic derivation path B2, and a voltage of the clock signals CK and CKB is outputted to the output terminal OUT. Specifically, the output signals A is High when the clock signals CK and CKB are High, and the output signals A is Low when the clock signals CK and CKB are Low.

On the other hand, the MOS transistor 41 turns ON when the output signal Q is Low (inactive). This conducts the logical derivation path B1. At the same time, the MOS transistor 42 turns OFF, which blocks the logical derivation path B2. Effected by this, the High signal is outputted to the output terminal OUT regardless of the level of the clock signals CK and CKB. Specifically, the output signals A is High.

In the NAND circuit of FIG. 4(*a*) also, the conduction switching operation between a plurality of logical derivation paths, each with different power source voltages used in deriving logic, is blocked while the output signals Q is Low (inactive). Consequently, the through current is suppressed, thereby suppressing the power consumption and the generation of high frequency noise. In addition, this arrangement designs the NAND circuit by using a switch. Such a design can reduce the number of transistors, thereby making it possible to attain a smaller NAND circuit.

FIG. 5 is a third arrangement of the NAND circuits 15*a* and 15*b*. These NAND circuits include MOS transistors 51 and 52. The MOS transistors 51 and 52 are of a p-channel type. In addition, one of two power sources is a voltage source VDD, and the other power source is a clock source line of the clock signals CK and CKB. As similar to FIG. 4(*a*), in the odd stages, the clock source line inputs the clock signal CKB as the clock signal, not the clock signal CK. Thus, the NAND operation result of the odd stages is derived from the clock signal CK and the output signal Q. In contrast, in the even stages, the clock source line inputs the clock signal CK as the clock signal, not the clock signal CKB. Thus, the NAND operation result of the even stages is derived from the clock signal CKB and the output signal Q.

The source of the MOS transistor 51 is connected to the voltage source VDD, and the drain of the MOS transistor 51 is connected to the source of the MOS transistor 52. The drain of the MOS transistor 52 functions as the input terminal of the clock signals CK and CKB. Namely, the drain of the MOS transistor functions as one of the input terminals of the NAND circuits 15*a* and 15*b*. The gate of the MOS transistor 51 functions as the input terminal of the output signal Q. Namely, the MOS transistor 51 functions as the other input terminal of the NAND circuits 15*a* and 15*b*. Furthermore, the gate of the MOS transistor 52 functions as the input terminal of an antiphase signal QB of the output signal Q. The antiphase signal QB may be obtained by passing the output signal Q through an inverter, or from a QB terminal of the flip-flop 11 not illustrated.

The High and Low level of the clock signals CK and CKB in this case is VDD and VSS, respectively.

In the NAND circuits 15*a* and 15*b* in this arrangement, a High signal is outputted to the output terminal OUT when the MOS transistor 51 is ON, and the voltage of the inputted clock signals CK and CKB is outputted to the output terminal OUT when the MOS transistor 52 is ON. A path from the voltage source VDD to the output terminal OUT via the transistor 51 is indicated as a logical derivation path B3, and a path from the input terminal of the clock signals CK and CKB to the output terminal OUT via the transistor 52 is indicated as a logical derivation path B4. In case of this arrangement, the logical derivation path B3 and the logical derivation path B4 form one logical derivation stage, which derives the High or Low logic to the output terminal OUT. A circuit to be connected to the latter stage of the output terminal OUT may be considered as a load of the logical derivation stage.

The logical derivation path B3 is the path which outputs the voltage of the voltage source VDD. Therefore, the logical derivation path B3 is a logical derivation path for High output.

The logical derivation path B3 switches to a source current path, if the clock signals CK and CKB are Low when the logical derivation path B3 conducts in the timing the logical derivation path B4 switches from a conducting state to a blocking state. The source current path flows current towards the output terminal OUT from the voltage source VDD. On the other hand, the current does not flow between the output terminal and the voltage source VDD of the logical derivation path B3, if the clock signals CK and CKB are High when the logical derivation path B3 conducts in the timing the logical derivation path B4 switches from a conducting state to a blocking state. The logical derivation path B4 functions as a sink current path, if the clock signals CK and CKB are Low when the logical derivation path B4 conducts in the timing the logical derivation path B3 switches from the conducting state to the blocking state. The sink current path flows current from the output terminal OUT towards the input terminal of the clock signals CK and CKB. On the other hand, the current does not flow between the output terminal OUT and the input terminal of the clock signals CK and CKB if the clock signals CK and CKB are High when the logical derivation path B4 conducts in the timing the logical derivation path B3 switches from the conducting state to the blocking stage. Subsequently, the logical derivation path B4 switches to a sink current path when the clock signals CK and CKB switch from High to Low, and to a source current path when the clock signals CK and CKB switch from Low to High. The source current path flows current towards the output terminal OUT from the input terminal of the clock signals CK and CKB. A source current and a sink current in this case flows immediately after the switching of the derived logic.

In the NAND circuits 15*a* and 15*b* of the above arrangement, the MOS transistor 51 turns OFF when the output signals Q is High (active). This blocks the logic derivation path B3. At the same time, the MOS transistor 52 turns ON. This allows current flow through the logic derivation path B3, and a voltage of the clock signals CK and CKB is outputted to the output terminal OUT. Specifically, the output signals A is High when the clock signals CK and CKB are High, and the output signals A is Low when the clock signals CK and CKB are Low.

On the other hand, the MOS transistor 51 turns ON when the output signals Q is Low (inactive). This allows current flow through the logical derivation path B1. At the same time, the MOS transistor 52 turns OFF, which blocks the logical derivation path B4. Effected by this, the High signal is outputted to the output terminal OUT regardless of the level of the clock signals CK and CKB. Specifically, the output signals A is High.

In the NAND circuit of FIG. 5 also, the conduction switching operation between a plurality of logical derivation paths, each with different power source voltages used in deriving logic, for example between the logical derivation path B3 and the logical derivation path B4 when the clock signals CK and CKB are Low, is blocked while the output signals Q is Low (inactive). Consequently, the through current is suppressed, thereby suppressing the power consumption and the generation of high frequency noise. In addition, this arrangement designs the NAND circuit by using a switch. Such a design can reduce the number of transistors, thereby making it possible to attain a smaller NAND circuit.

Differently from FIG. 4(*a*), the arrangement of FIG. 5 may further form the NAND circuits 15*a* and 15*b*, that is, the clock pulse extracting sections 13*a* and 13*b* just by using the p-channel MOS transistor. Similarly, the NAND circuits 15*a* and 15*b*, that is, the clock pulse extracting sections 13*a* and 13*b* may be formed by using just the n-channel MOS transistor. By forming the whole circuit of the shift register including the circuits other than the clock pulse extracting sections 13a and 13b by just using the MOS transistor of one polarity, the manufacturing process is simplified, thereby enabling the reduction of manufacturing costs.

The above dealt with the hindering of the conduction switching operation between a plurality of logical derivation paths each using different power source voltages for deriving logic, giving an example of between two logical derivation paths. The present invention is not limited to this, and may be applied for hindering the conduction switching operation between three or more logical derivation paths each using different power source voltages for logic derivation. The same is applied as the aforementioned example in hindering the conduction switching operation, by using the inactive output signals Q, for example, to maintain the logical derivation paths other than the logical derivation path to be used in a blocking state.

The above is the description of the present embodiment. The above example dealt with the logical operation which is performed by the race hazard preventing circuit 12, in the cases of: (i) using the output signals Q, the clock signal CK and the clock signal CKB; (ii) a predetermined stage using the output signals Q and the clock signal CK; and (iii) a predetermined stage using the output signals Q and the clock signal CKB. Whether or not one or both of the clock signal CK and the clock signal CKB is used other than the output signals Q is only a detailed formal request due to the circuit arrangement. Generally, the logical operation in an arbitrary stage is sufficient using the output signals Q and at least one of the clock signal CK and the clock signal CKB.

Second Embodiment

The following description deals with another embodiment of the present invention, with reference to FIGS. 6 through 11. Unless explained otherwise, members with the same reference numerals as what are explained in First Embodiment have the same function.

Race hazard may occur in the arrangement of FIG. 1 of First Embodiment, if a rising and decaying exponential of a waveform of the clock signals CK and CKB is large, and a difference exists in the logic threshold value between the logic gates such as between the NAND circuits 15a and 15b and the NOR circuits 16a and 16b. FIGS. 6(a) through 6(c) illustrate what kind of effect the High and Low of a clock signal CKnand and the High and Low of a clock signal CKnor give to the output signals X, Q and A, when the waveform of the clock signal CK is risen or decayed, and a difference exists between the logical threshold value V THnand of the NAND circuits 15a and 15b and the logical threshold value V THnor of the NOR circuits 16a and 16b. The clock signal CKnand is a signal which is recognized by the NAND circuits 15a and 15b, and the clock signal CKnor is a signal which is recognized by the NAND circuits 16a and 16b. The waveform of the clock signal CKB is also exponentially risen or decayed, as similar to the clock signal CK, however this is not illustrated. FIG. 6 illustrates the output signals Xn−1, Qn and An as representative examples.

FIG. 6(a) is a figure illustrating the case in which the conduction switching operation between the High and Low in each logic gate can be assumed as being carried out in an instant, and the inequality V THnand≧V Thnor is satisfied. The NAND circuits 15a and 15b output a pulse of an output signal An in a normal operation timing. This allows a pulse of an output signal Xn to also output in the normal operation timing. Therefore, the shift register 1 properly operates.

FIG. 6(b) is a figure illustrating the case in which the conduction switching operation between the High and Low in each logic gate can be assumed as being carried out in an instant, and the inequality V THnand<V THnor is satisfied. The NAND circuits 15a and 15b output a pulse of an output signal An in a wrong operation timing. This allows a pulse of an output signal Xn to also output in the wrong operation timing. Therefore, the race hazard occurs in the shift register.

FIG. 6(c) is a figure illustrating the case in which a transition state appears in the logic switching between the High and Low in each logic gate not being carried out in an instant, and the inequality V THnand<V THnor is satisfied. As an example of this, FIG. 6(c) illustrates a state having a slightly large rising and decaying exponential of the waveform in the clock signal CK. The logical switching of the clock signal CKnand and CKnor are illustrated as the same as being instant for convenience, however the outputs Xn−1, Qn and An are illustrated having the transition state. In this case, the NAND circuits 15a and 15b output a V-shaped pulse of the output signal An in the wrong operation timing. The pulse widens in a width td and a bottom part VX lowers (that is, the pulse greatens) when the difference between the logical threshold value V THnand and the logical threshold value V THnor greatens. On the other hand, the pulse narrows in the width td and the bottom part VX rises (that is, the pulse decreases) when the difference between the logical threshold value V THnand and the logical threshold value THnor decreases. The race hazard occurs in the shift register 1 if the V-shaped pulse greatens and the bottom part VX falls below the logical threshold value V THnor of the NOR circuits 16a and 16b.

The rising and decaying exponential of the waveform of the clock signals CK and CKB is caused by the increase in load in which the clock signal is to transmit, due to the increase in the size of the liquid crystal panel causing the wirings to lengthen. In addition, the rising and decaying exponential of the waveform readily causes the race hazard if the clock signals CK and CKB are of high frequency, and the period of the rising and decaying exponential of the waveform becomes a level which cannot be ignored with respect to the clock period.

In addition, if the output signals Q function as the output signals of the shift register 1 in FIG. 1, it is preferable that the output signal of a certain stage of the shift register 1 and the output signal of the stage two stages thereafter do not overlap with each other. The reason of this is as follows. Assume the shift register 1 has a double duration pulse output, and current flow through an analog switch which opens and shuts a source signal line of a certain stage due to the double duration pulse. While current flow through the analog switch, a double duration pulse of a next stage is outputted from the middle of the double duration pulse of its own stage. This allows current flow through the analog switch of the next stage. Therefore, in the state where both the analog switches of its own stage and the next stage are turned ON to allow current flow therethrough, the source signal line of its own stage and the source signal line of its next stage are charged by the data signal voltage of its own stage. The voltage of the charged source signal line stabilizes due to the completion of the charging, by the time the voltage of the double duration pulse falls low. Consequently, having blocked the analog switch of its own stage, the source signal of its next stage is consecutively charged by the data signal of its next stage. While the analog switch of its next stage allows current flow, a double duration pulse of its second latter stage is outputted from the middle of the double duration pulse of its next stage. Therefore, the source signal lines of its next stage and its second latter stage is charged by the data signal line of its next stage. However, if current flow through the analog switch of its second latter stage caused by the output of the double duration pulse to its second latter stage while the double duration pulse of its own stage still has not completed, the stable voltage of the charged source signal line of its own stage is subject to change. Thus, it is preferable to output the double duration pulse of its second latter stage following the fall of the double duration pulse of its own stage.

Figure 7:
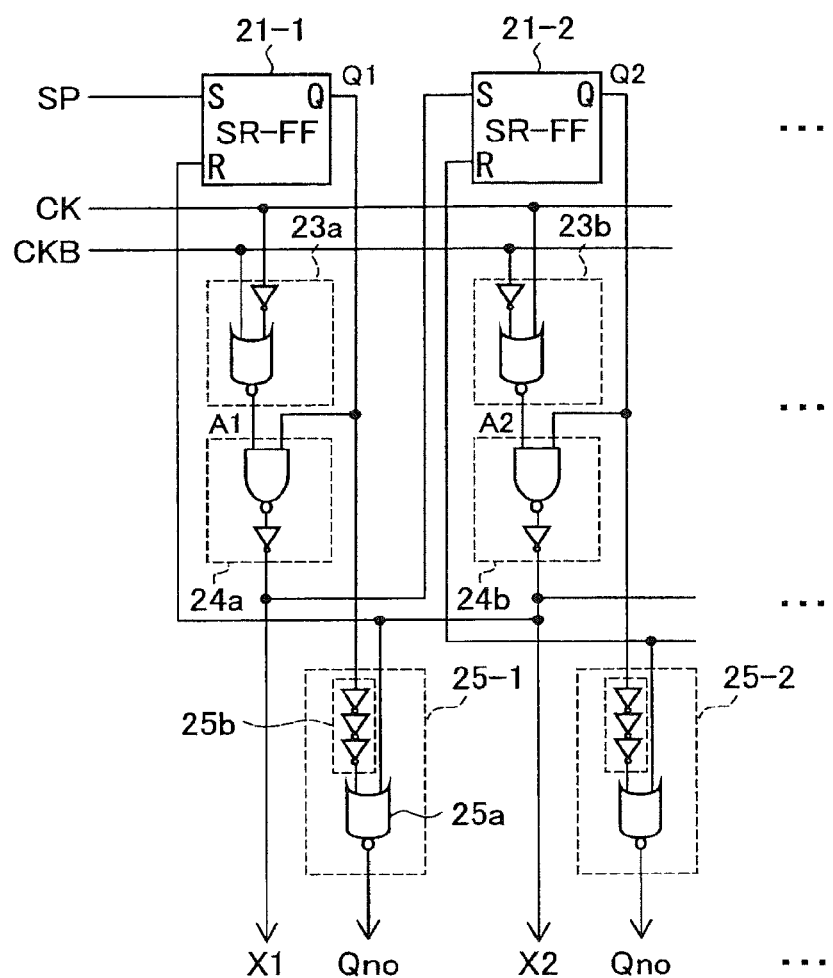
FIG. 7 illustrates a conventional art, and is a circuit block diagram schematically illustrating an essential part of a shift register, which removes the overlap of a double duration pulse.

FIG. 7 is a conventional arrangement which prevents the overlapping of the double duration pulse. FIG. 7 is a circuit in which double duration pulse overlap-removing sections 25 (25-1, 25-2, . . . ) are added to the shift register 201 in FIG. 14. The double duration pulse overlap-removing section 25 includes a NOR circuit 25a and a delay circuit 25b. The delay circuit 25b is a circuit having a predetermined number of inverters connected in series, and its input terminal receives an output signal Q of a flip-flop 21 in its own stage. The NOR circuit 25a performs the NOR operation on an output signal of the delay circuit 25 and the output signal X of its next stage, and outputs an output signal Qno as the double duration pulse.

The present embodiment prevents the race hazard which is caused by the rising and decaying exponential of the waveform in the clock signals CK and CKB, the change in frequency of the clock signals CK and CKB to high-frequency, the variation in the logical threshold value in the logical operation circuit and the like. The present embodiment also performs the removal of the overlap in the double duration pulse.

Figure 8:
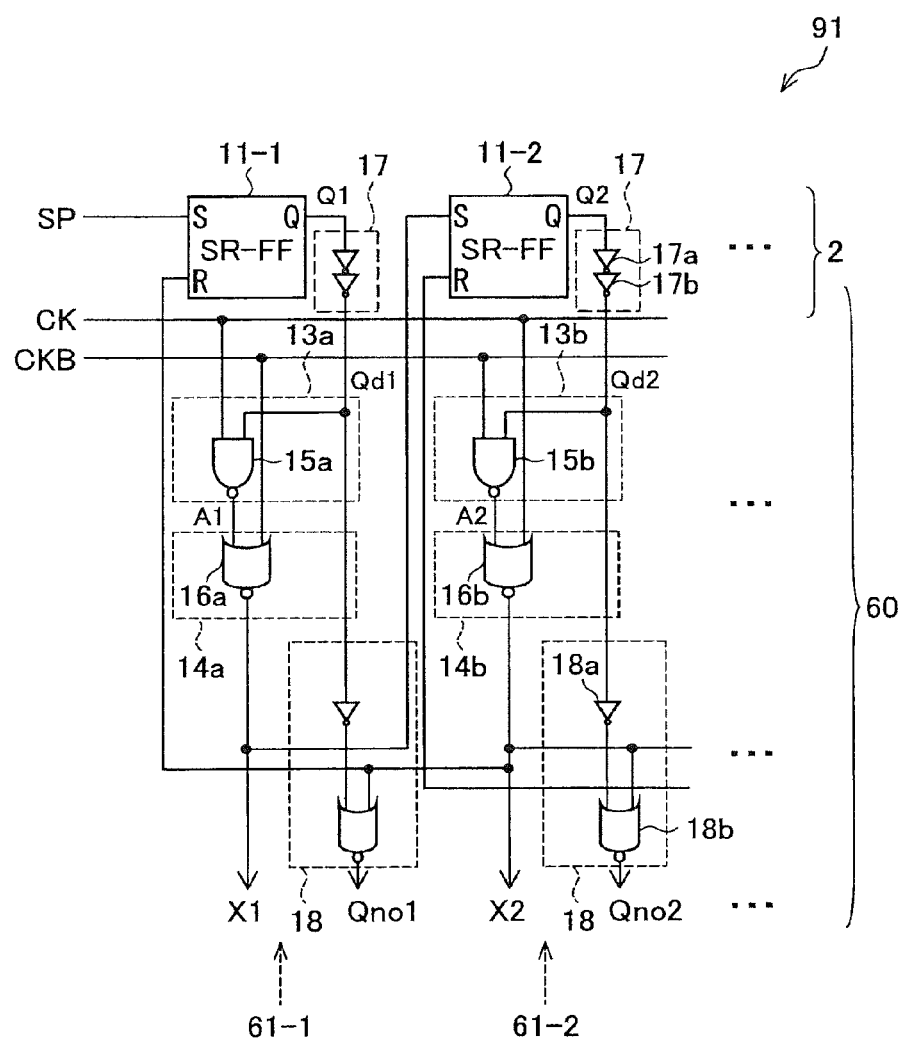
FIG. 8 illustrates Second Embodiment of the present invention, and is a circuit block diagram illustrating an essential part of a shift register.

FIG. 8 illustrates part of an arrangement of a shift register 91 pertaining to the present embodiment.

The shift register 91 includes a flip-flop section 2 and a race hazard preventing section 60. The race hazard preventing section 60 includes a race hazard preventing circuit 61 (61-1, 61-2, and on) on each stage. The race hazard preventing circuits 61 include a clock pulse extracting section 13 (13a, 13b), a waveform timing shaping section 14 (14a, 14b), a delay circuit 17, and a double duration pulse generating circuit 18.

The delay circuit 17 is formed by a series circuit of an inverter 17a and an inverter 17b. An input terminal of the delay circuit receives an output signal Q from a flip-flop 11 of the same stage as the delay circuit 17. The delay 17 generates and outputs a delay signal Qd (Qd1, Qd2, . . . (the end numeral indicates the stage numeral it belongs)) by the two inverters 17a and 17b. The delay signal Qd is a signal in which the output signal Q is delayed.

One of the input terminals of the NAND circuit 15a in the clock pulse extracting section 13a receives the clock signal CK, as similar to FIG. 1. The other input terminal of the NAND circuit 15a receives the delay signal Qd (Qd1, Qd3, . . . ) generated in the same stage as that of the NAND circuit 15a. Similarly, one of the input terminals of the NAND circuit 15b in the clock pulse extracting section 13b receives the clock signal CKB as similar to FIG. 1, and the other input terminal of the NAND circuit 15b receives the delay signal Qd (Qd2, Qd4, and on) generated in the same stage as that of the NAND circuit 15b.

The double duration pulse generating circuit 18 includes an inverter 18a and a NOR circuit 18b. The input terminal of the inverter 18a receives the delay signal Qd generated in the same stage as the double duration pulse generating circuit 18. The NOR circuit 18b performs a NOR operation on the output signal of the inverter 18a and the output signal X of its next stage, and generates and outputs an output signal Qno (Qno1, Qno2, and on) as the double duration pulse.

The race hazard preventing circuit 61 of the above arrangement is one which the delay circuit 17 and the double duration pulse generating circuit 18 is added to the clock pulse extracting section 13 (13a, 13b) and the waveform timing shaping section (14a, 14b) of FIG. 1. The race hazard preventing circuit 61 is arranged by using a logical operational circuit which performs MOS type logical operation.

Figure 9:
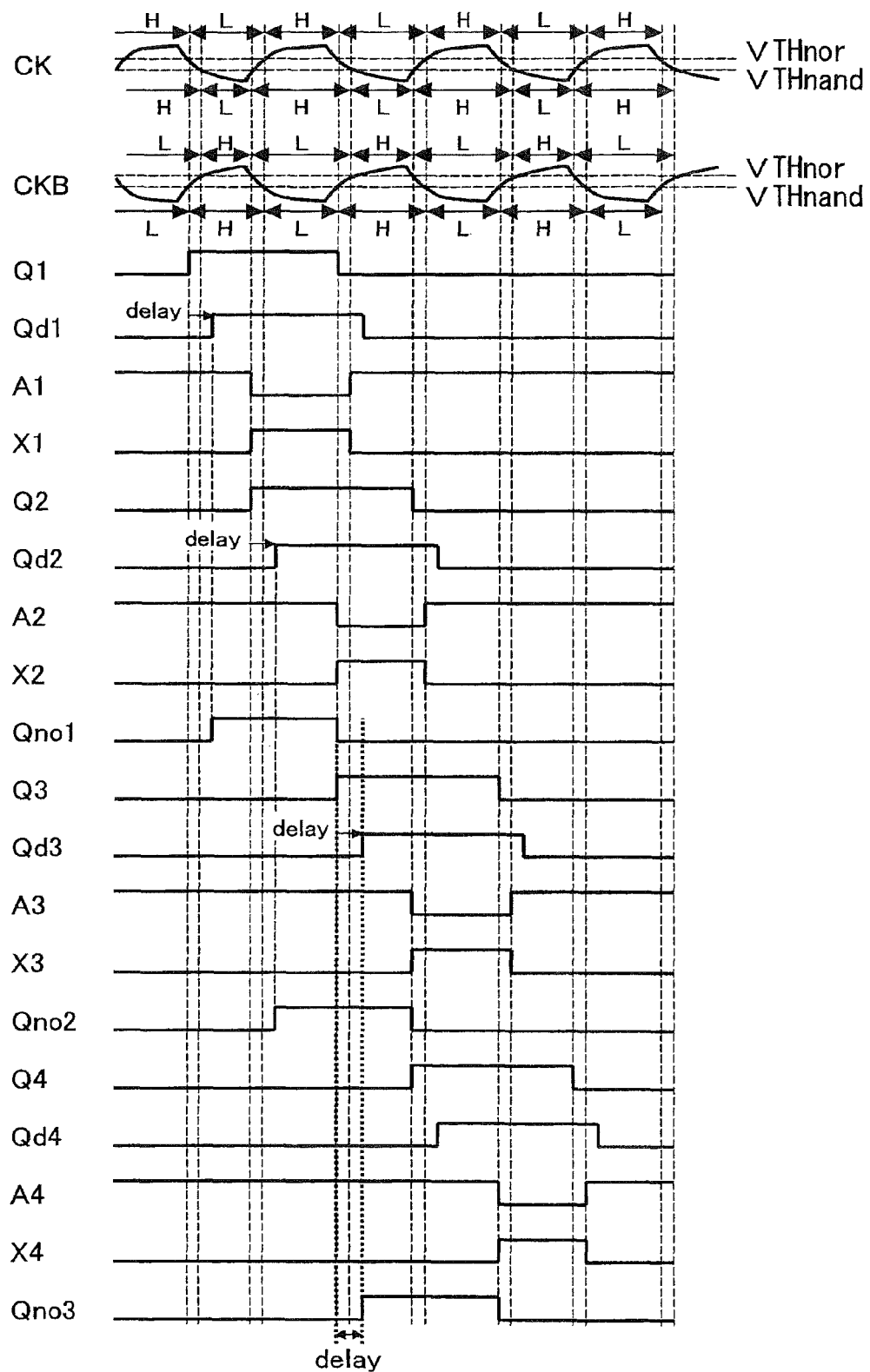
FIG. 9 is a timing chart explaining operation of the shift register of FIG. 8.

FIG. 9 illustrates a timing chart describing the operation of the shift register 91. The clock signals CK and CKB have a rising and decaying exponential of a waveform as similar to FIGS. 6(a) through 6(c), and the inequality V THnand<V THnor is satisfied. The "H" and "L" on the lower side of the clock signals CK and CKB indicate the High and Low recognized by the NAND circuits 15a and 15b, and the upper side of the "H" and "L" indicate the High and Low recognized by the NOR circuits 16a and 16b.

As shown in FIG. 9, the output signal Q1 is converted to the delay signal Qd1, which is then inputted to the clock pulse extracting section 13a. Consequently, until the clock signal CK in the High period starts to be extracted, the NAND circuit 15a just performs (i) the NAND operation using the clock signal CK recognized as High, and the Low delay signal Qd1, and (ii) the NAND operation using the clock signal CK recognized as Low, and the delay signal Qd1. Therefore, an output signal A1 would not switch to Low. As a result, the NAND circuit 15a generates the output signal A1 being a result of properly extracting just the predetermined amount of pulse (one clock pulse in this case) from the clock signal CK. In addition, the NOR circuit 16a recognizes the clock signal CKB as Low during the period the High clock signal CK is extracted. Therefore, the NOR circuit 16a generates and outputs the output signal X1 of which the phase of the output signal A1 is exactly inverted. The similar signal generation is performed in each stage thereafter.

When extracting the pulse of the clock signal CK, if the delay of the delay signal Qd1 with respect to the output signal Q1 ends while the extracted pulse of the clock signal CK has not started, one whole pulse of the clock signal CK is extracted. However, if the delay does not end while the extracted pulse has not started, a pulse shorter than one pulse of the clock signal CK is extracted. The embodiment allows proper generation of the start timing of the output signal X1, by ending the delay while the pulse extraction has not started.

In addition, conversion of the output signals Q (Q1, Q2, . . . ) to the delay signals Qd (Qd1, Qd2, . . . ) allows a delayed start of the pulse of the delay signals Qd2, Qd3 and Qd4 compared to the pulse edge of the output signals Q (Q1, Q2, . . . ), delayed to the degree of the "delay" part in the drawing. The pulse of the output signal Qno1 starts from the start timing of the pulse of the delay signal Qd1, and ends on the start timing of the pulse of the output signal X2. The pulse of the output signal Qno2 starts from the start timing of the pulse of the delay signal Qd2, and ends on the start timing of the pulse of the output signal X3. The pulse of the output signal Qno3 starts from the start timing of the pulse of the delay signal Qd3, and ends on the start timing of the pulse of the output signal X4. As such, a space worth the "delay" amount is always provided between the pulse of the output signal Qno and the pulse of the output signal Qno two stages later. As such, the input signal for the flip-flop following that stage can be properly generated, and the overlap in the double duration pulse can be removed, even if the rising and decaying exponential of the waveform exists in the clock signals CK and CKB and a difference generates in the logical threshold value between the logic gates as like the inequality VTHnand<VTHnor.

Figure 10:
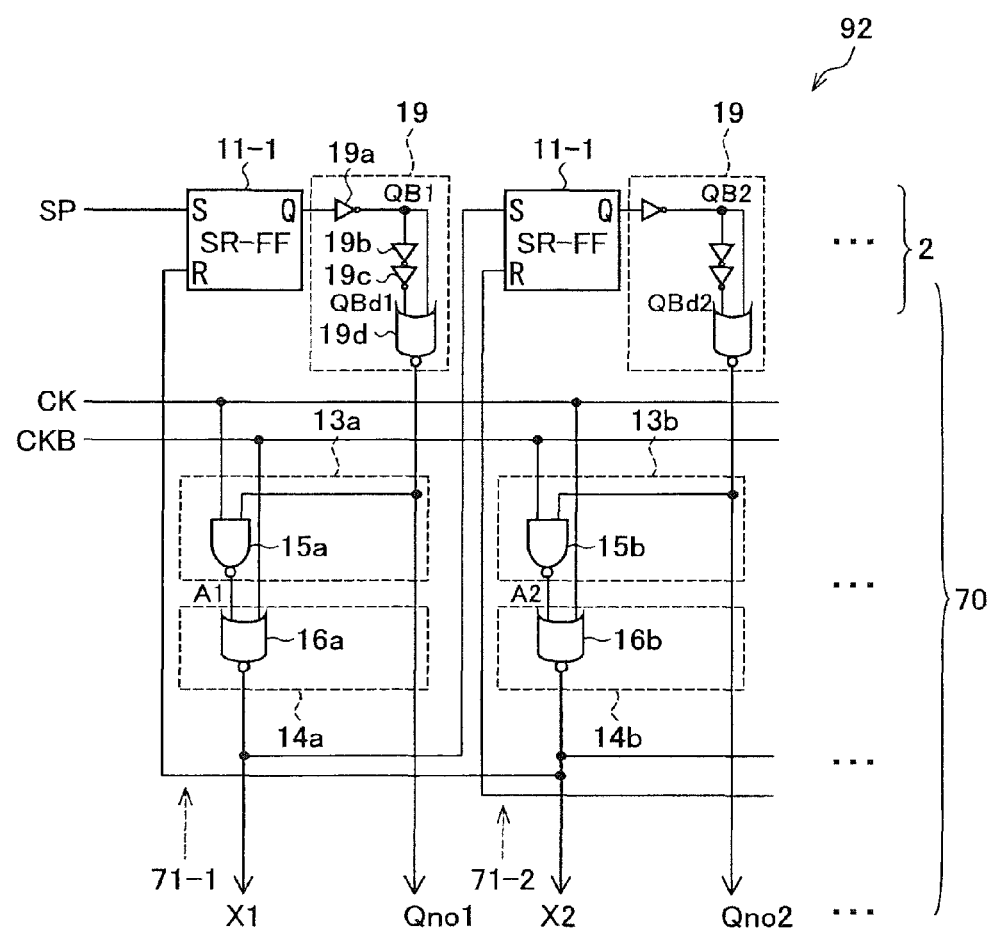
FIG. 10 illustrates Second Embodiment of the present invention, and is a circuit block diagram illustrating an essential part of another shift register.

FIG. 10 illustrates part of an arrangement of a shift register 92, which is another shift register pertaining to the present embodiment.

The shift register 92 includes a flip-flop section 2 and a race hazard preventing section 70. The race hazard preventing section 70 includes a race hazard preventing circuit 71 (71-1, 71-2, and on) on each stage. The race hazard preventing circuits 71 include a clock pulse extracting section 13 (13a, 13b), a waveform timing shaping section 14 (14a, 14b), and a delay circuit 19.

The delay circuit 19 includes inverters 19a, 19b and 19c, and a NOR circuit 19d. The inverter 19a receives an output signal Q (Q1, Q2, . . . ) from the flip-flop 11 of the same stage as the inverter 19a, and the inverter 19b outputs an antiphase signal QB (QB1, QB2, . . . ) of the output signal Q. The inverter 19b and the inverter 19c are connected in series. The inverter 19b receives the antiphase signal QB, and the output signal of the inverter 19b is received by the inverter 19c. The antiphase signal QB is delayed by the inverters 19b and 19c, and is outputted from the inverter 19c as a delay signal QBd (QBd1, QBd2, . . . ). The NOR circuit 19d performs a NOR operation on the antiphase signal QB and the output signal of the inverter 19c, and generates and outputs an intermediate signal Qno (Qno1, Qno2, . . . ). The intermediate signal Qno also functions as a double duration pulse as the output signal of the shift register 92.

One of the input terminals of the NAND circuit 15a in the clock pulse extracting section 13a receives the clock signal CK, as similar to FIG. 1. The other input terminal of the NAND circuit 15a receives the intermediate signal Qno (Qno1, Qno3, . . . ) generated in the same stage as the NAND circuit 15a. In addition, one of the input terminals of the NAND circuit 15b of the clock pulse extracting section 13b receives the clock signal CKB, and the other input terminal of the NAND circuit 15b receives the intermediate signal Qno (Qno2, Qno4, . . . ) generated in the same stage as the NAND circuit 15a.

The race hazard preventing circuit 71 of the above arrangement is one which the delay circuit 19 is added to the clock pulse extracting section 13 (13a, 13b) and the waveform timing shaping section (14a, 14b) of FIG. 1. The race hazard preventing circuit 71 is arranged by using a logical operational circuit which performs MOS type logical operation.

Figure 11:
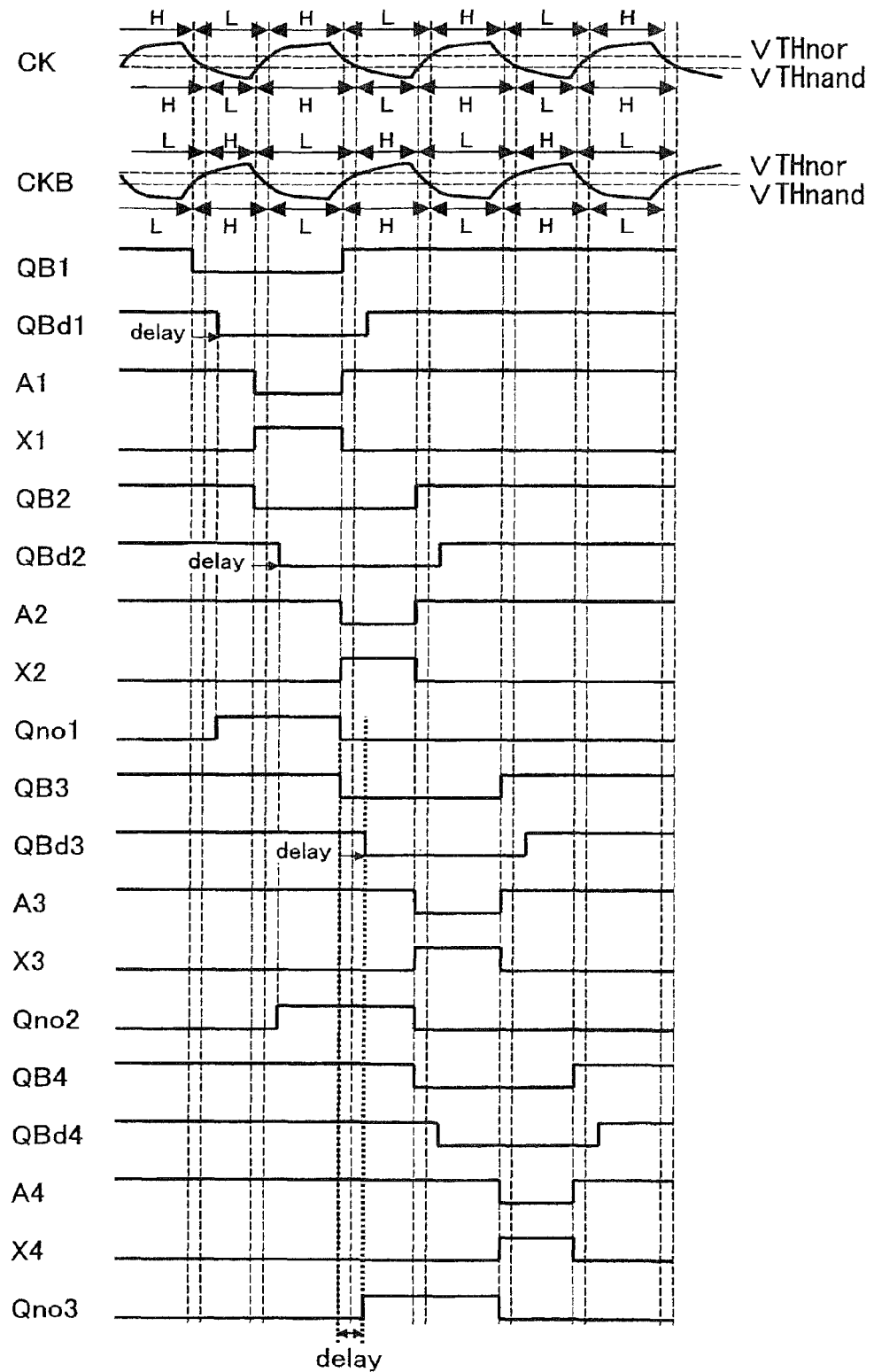
FIG. 11 is a timing chart explaining operation of the shift register of FIG. 10.
Figure 12:
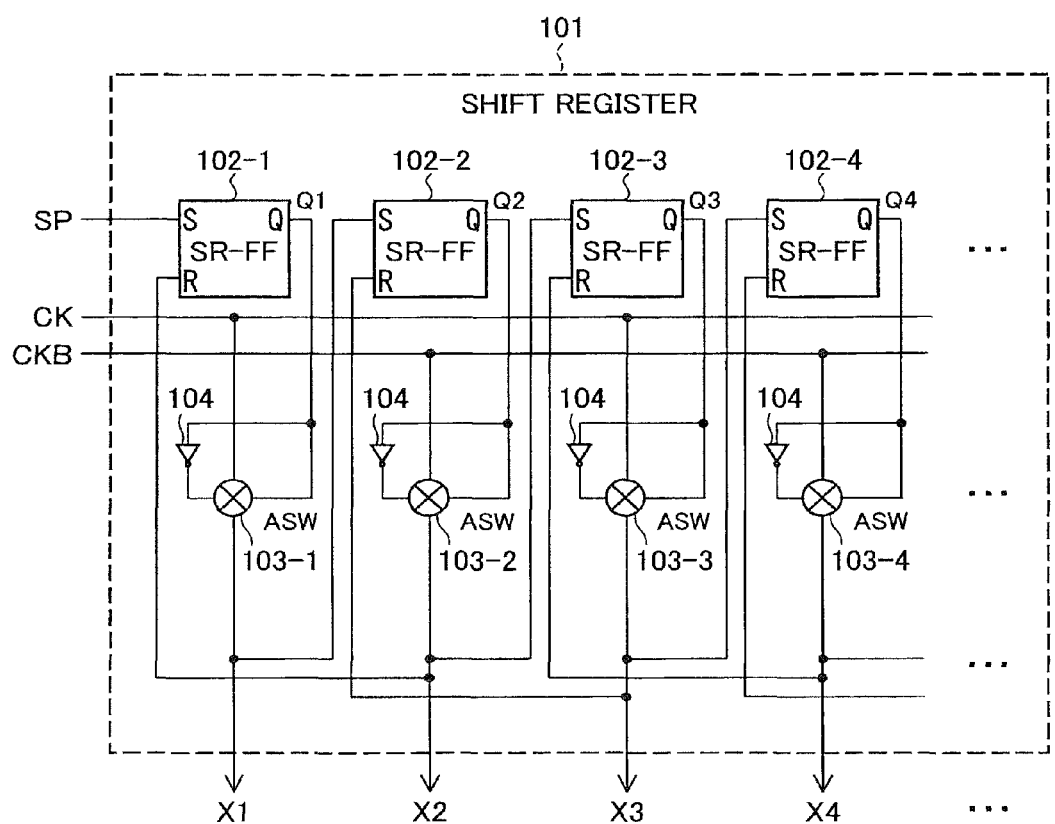
FIG. 12 illustrates a conventional art, and is a circuit block diagram illustrating an essential part of a shift register.
Figure 13:
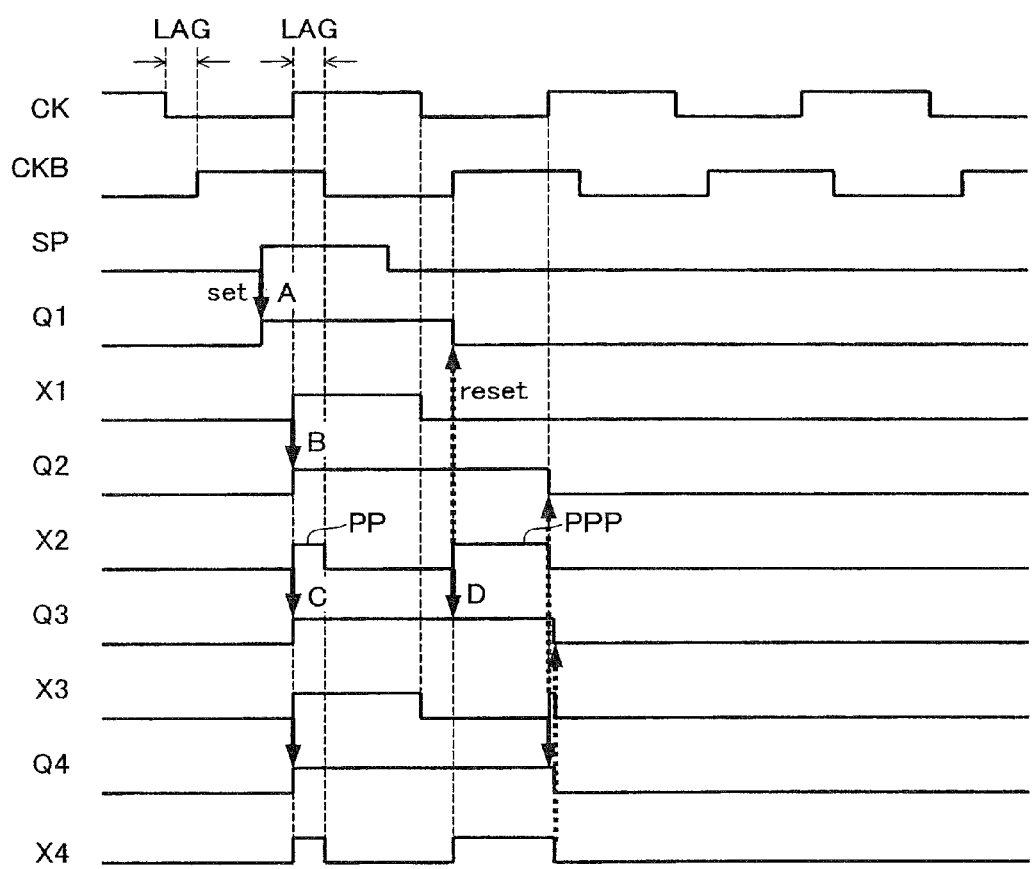
FIG. 13 is a timing chart illustrating operation of the shift register of FIG. 12.
Figure 1:
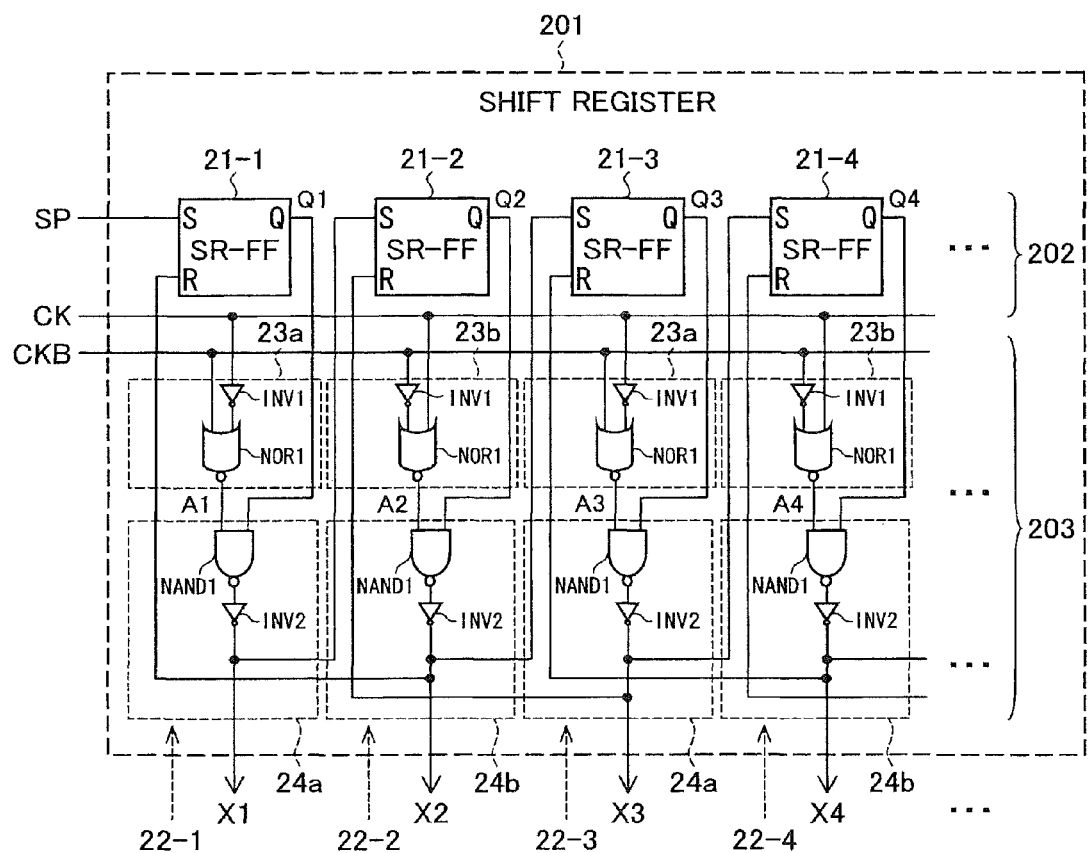
Figure 15:
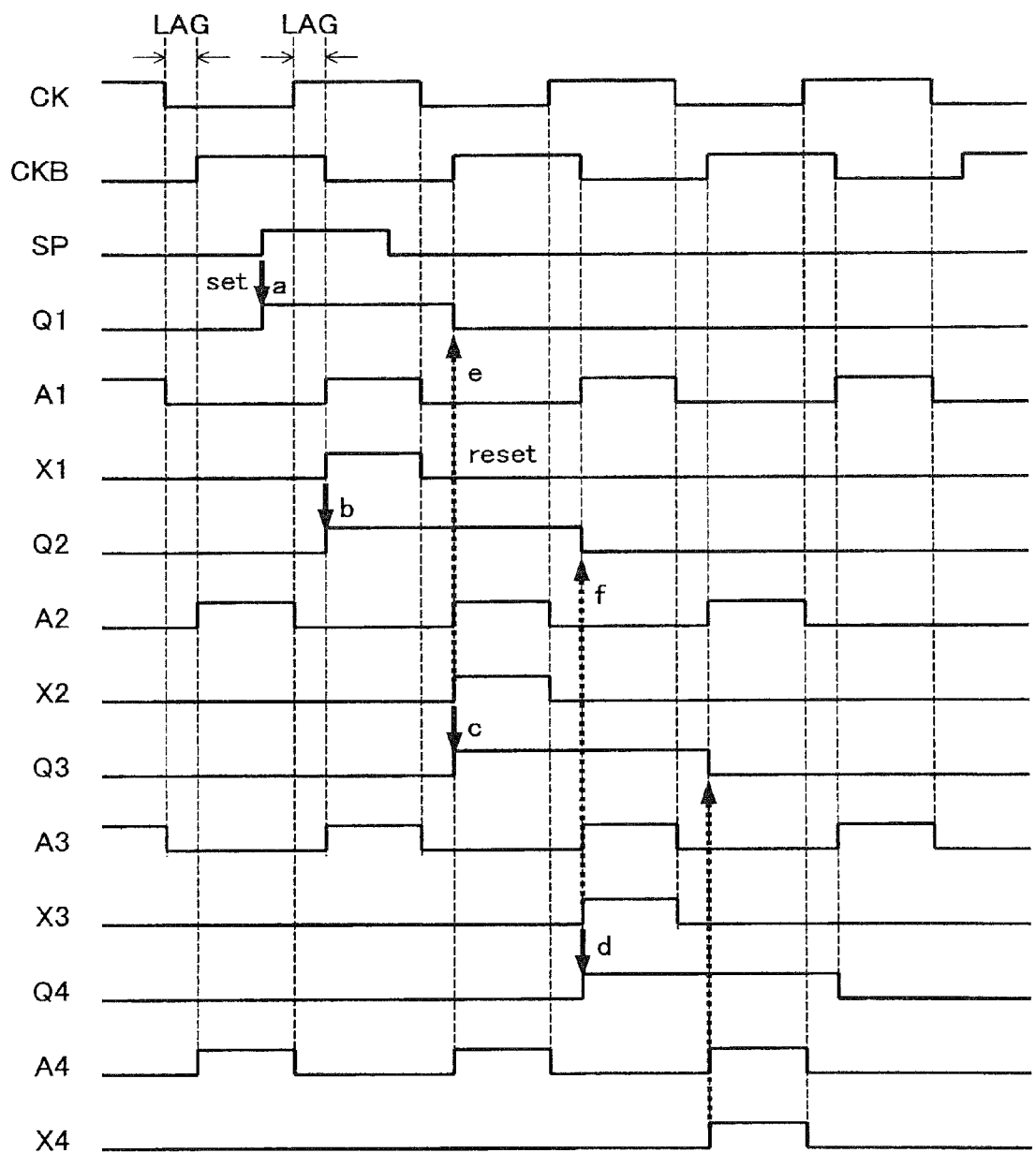
FIG. 15 is a timing chart explaining operation of the shift register of FIG. 14.

FIG. 11 illustrates a timing chart describing the operation of the shift register 92 in the above arrangement. The clock signals CK and CKB have the rising and decaying exponential of the waveform as similar to FIGS. 6(a) through 6(c), and the inequality V THnand<V THnor is satisfied. The "H" and "L" on the lower side of the clock signals CK and CKB indicate the High and Low recognized by the NAND circuits 15a and 15b, and the upper side of the "H" and "L" indicate the High and Low recognized by the NOR circuits 16a and 16b.

As shown in FIG. 11, the antiphase signal QB 1 generated from the output signal Q1 is converted to the intermediate signal Qno1, which is then inputted to the clock pulse extracting section 13a. Consequently, until the clock signal CK in the High period starts to be extracted, the NAND circuit 15a just performs (i) a NAND operation on the clock signal CK which is recognized as High, and the Low intermediate signal Qno1, and (ii) a NAND operation on the clock signal CK which is recognized as Low, and the delay signal Qno1. Therefore, the output signal A1 would not switch to Low. As a result, the NAND circuit 15a generates the output signal A1, which is a result of properly extracting just the predetermined amount of pulse (a pulse shorter than one clock pulse in this case) from the clock signal CK. In addition, the NOR circuit 16a recognizes the clock signal CKB as Low while the High clock signal CK is extracted. Therefore, the NOR circuit 16a generates and outputs the output signal X1 of which the phase of the output signal A1 is exactly inverted. The similar signal generation is performed in each stage thereafter.

When extracting the pulse of the clock signal CK, if the delay of the delay signal QBd1 (antiphase signal QBd1) with respect to the output signal Q1 ends while the extracted pulse of the clock signal CK has not started, one whole pulse of the clock signal CK is extracted. However, if the delay does not end while the extracted pulse has not started, a pulse shorter than one pulse of the clock signal CK is extracted. The embodiment allows proper generation of the start timing of the output signal X1, by ending the delay while the pulse extraction has not started.

In addition, conversion of the output signals Q (Q1, Q2, and on) to the delay signals QBd (Qd1, Qd2, and on) allows a delayed start of the pulse of the delay signals QBd2, QBd3 and QBd4 compared to the pulse edge of the antiphase signals QB, delayed to the degree of the "delay" part in the drawing. The pulse of the intermediate signal Qno1, which is the output signal of the shift register 92, starts from the start timing of the pulse of the delay signal QBd1, and ends on the start timing of the pulse of the output signal X2. The pulse of the intermediate signal Qno2, which is the output signal of the shift register 92, starts from the start timing of the pulse of the delay signal QBd2, and ends on the start timing of the pulse of the output signal X3. The pulse of the output signal Qno3, which is the output signal of the shift register 92, starts from the start timing of the pulse of the delay signal QBd3, and ends on the start timing of the pulse of the output signal X4. As such, a space worth the "delay" amount is always provided between the pulse of the output signal Qno and the pulse of the output signal Qno two stages later. As such, the input signal for the flip-flop following that stage can be properly generated, and the overlap in the double duration pulse can be removed, even if the rising and decaying exponential of the waveform exists in the clock signals CK and CKB and a difference generates in the logical threshold value between the logic gates as like the inequality VTHnand<VTHnor.

The driving circuit of the present invention may be arranged such that the first clock signal and the second clock signal have a High and Low period equal in length, and the first clock signal and the second clock signal are not inphase with respect to each other, and the logical operation performs in odd ones or even ones of the stages of the shift register (i) a first NAND operation, which is a NAND operation on the output signal of the flip-flop and the first clock signal, and (ii) a first NOR operation, which is a NOR operation on a first NAND operation result and the second clock signal, and performs in the other ones of the stages of the shift register (i) a second NAND operation, which is a NAND operation on the output signal of the flip-flop and the second clock signal, and (ii) a second NOR operation, which is a NOR operation on a second NAND operation result and the first clock signal.

According to the invention, a first NAND operation is performed in odd ones or even ones of the stages of the shift register, and a second NAND operation is performed in the other ones of the stages of the shift register. Consequently, the predetermined logical derivation path can be maintained in a blocked state in each logical derivation stage while the output signal from the flip-flop is inactive by using the inactive output signal from the flip-flop. Therefore, it is possible to hinder the switching operation of a plurality of logical derivation paths with accordance to the periodic level change of the first clock signal or the second clock signal, in each logic derivation stage.

Accordingly, the output signal of the shift register is generated by a first NOR operation which uses the result of the first NAND operation, and a second NOR operation which uses the result of the second NAND operation. This output signal of the shift register can be accepted by the next flip-flop as an input signal. The first clock signal and the second clock signal have a High and Low period equal in length, and the first clock signal and the second clock signal are not inphase. However, the arrangement of the present invention prevents the overlapping of input signals for the flip-flops between stages, thereby preventing the race hazard of the shift register.

As from the above, a driving circuit is easily realized which achieves the effect of (i) preventing the race hazard of the shift register and (ii) suppressing the increase in power consumption and the occurrence of high frequency noise caused by the through current.

The driving circuit of the present invention may be arranged such that the first clock signal and the second clock signal have a High and Low period equal in length, and the first clock signal and the second clock signal are not inphase with respect to each other, and the logical operation (a) generates, by delaying the output signal of the flip-flop, a delay signal to be inputted to the logical derivation circuit, (b) performs in odd ones or even ones of the stages of the shift register (i) a first NAND operation, which is a NAND operation on the delay signal and the first clock signal, and (ii) a first NOR operation, which is a NOR operation on a first NAND operation result and the second clock signal, and (c) performs in the other ones of the stages of the shift register (i) a second NAND operation, which is a NAND operation on the delay signal and the second clock signal, and (ii) a second NOR operation, which is a NOR operation on a second NAND operation result and the first clock signal.

According to the invention, a first NAND operation is performed in odd ones or even ones of stages of the shift register, and a second NAND operation is performed in the other ones of the stages of the shift register. Consequently, the predetermined logical derivation path can be maintained in a blocked state in each logical derivation stage while the output signal from the flip-flop is inactive by using the inactive output signal from the flip-flop. Therefore, it is possible to hinder the conduction switching operation of a plurality of logical derivation paths with accordance to the periodic level change of the first clock signal or the second clock signal, in each logic derivation stage.

Accordingly, the output signal of the shift register is generated by a first NOR operation which uses the result of the first NAND operation, and a second NOR operation which uses the result of the second NAND operation. This output signal of the shift register can be accepted by the next flip-flop as an input signal. The first clock signal and the second clock signal have a High and Low period equal in length, and the first clock signal and the second clock signal are not inphase. However, the arrangement of the present invention prevents the overlapping of input signals for the flip-flops between stages, thereby preventing the race hazard of the shift register.

With this arrangement, a driving circuit is easily realized which achieves the effect of (i) preventing the race hazard of the shift register and (ii) suppressing the increase in power consumption and the occurrence of high frequency noise caused by the through current.

In addition, the delay signal of the output signal of the flip-flop is used for the first NAND operation and the second NAND operation. Thus, the input signal for the next flip-flop can be properly generated, even if the rising and decaying exponential of the waveform exists in the first and second clock signals and a difference generates in the logical threshold value between the logic gates of the logical operation circuit.

Furthermore, the use of the delay signal allows generating of a double duration pulse as the output signal of the shift register, of which the double duration pulse and an output signal of the shift register two stages later do not overlap with each other.

The driving circuit of the present invention may be arranged such that the first clock signal and the second clock signal have a High and Low period equal in length, and the first clock signal and the second clock signal are not inphase with respect to each other, and the logical operation (a) generates, by delaying an antiphase signal of the output signal of the flip-flop, a delay signal to be inputted to the logical derivation circuit, (b) generates an intermediate signal by a NOR operation on the delay signal and the antiphase signal, (c) performs in one odd ones or even ones of the stages of the shift register (i) a first NAND operation, which is a NAND operation on the intermediate signal and the first clock signal, and (ii) a first NOR operation, which is a NOR operation on a first NAND operation result and the second clock signal, and (d) performs in the other ones the stages of the shift register (i) a second NAND operation, which is a NAND operation on the intermediate signal and the second clock signal, and (ii) a second NOR operation, which is a NOR operation on a second NAND operation result and the first clock signal.

According to the invention, a first NAND operation is performed in odd ones or even ones of the stages of the shift register, and a second NAND operation is performed in the other ones of the stages of the shift register. Consequently, the predetermined logical derivation path can be maintained in a blocked state in each logical derivation stage while the output signal from the flip-flop is inactive by using the inactive output signal from the flip-flop. Therefore, it is possible to hinder the switching operation of a plurality of logical derivation paths with accordance to the periodic level change of the first clock signal or the second clock signal, in each logic derivation stage.

Accordingly, the output signal of the shift register is generated by a first NOR operation which uses the result of the first NAND operation, and a second NOR operation which uses the result of the second NAND operation. This output signal of the shift register can be accepted by the next flip-flop as an input signal. The first clock signal and the second clock signal have a High and Low period equal in length, and the first clock signal and the second clock signal are not inphase. However, the arrangement of the present invention prevents the overlapping of input signals for the flip-flops between stages, thereby preventing the race hazard of the shift register.

With this arrangement, a driving circuit is easily realized which achieves the effect of (i) preventing the race hazard of the shift register and (ii) suppressing the increase in power consumption and the occurrence of high frequency noise caused by the through current.

In addition, the delay signal of the output signal of the flip-flop and the intermediate signal which is generated from the delay signal is used for the first NAND operation and the second NAND operation. Thus, the input signal for the next flip-flop can be properly generated, even if the rising and decaying exponential of the waveform exists in the first and second clock signals and a difference generates in the logical threshold value between the logic gates of the logical operation circuit.

Furthermore, the use of the intermediate signal allows generating of a double duration pulse as the output signal of the shift register, of which the double duration pulse and an output signal of the shift register two stages later do not overlap with each other.

The driving circuit of the present invention may be arranged such that the generated input signal for the next flip-flop also functions as an output signal of the shift register.

According to the invention, there is no need to generate a separate input signal for the next flip-flop other than the output signal of the shift register.

The driving circuit of the present invention may be arranged such that the output signal of the shift register is generated by a NOR operation on (i) an antiphase signal of the delay signal and (ii) an input signal of the flip-flop following the next flip-flop.

According to the invention, a double duration pulse is easily generated from the delay signal as an output signal of the shift register, of which the double duration pulse and an output signal of the shift register two stages later do not overlap.

The driving circuit of the present invention may be arranged such that the intermediate signal is outputted as the output signal of the shift register.

According to the invention, a double duration pulse is easily generated as an output signal of the shift register, of which the double duration pulse and an output signal of the shift register two stages later do not overlap.

The display device of the present invention may include the driving circuit and the display panel.

According to the present invention, a display device is realized which achieves the effect of suppressing the increase in power consumption and the occurrence of high frequency noise, each of which are caused by the through current.

The driving method according to the present invention for the display device may be a method in which the first clock signal and the second clock signal have a High and Low period equal in length, and the first clock signal and the second clock signal are not inphase with respect to each other, the step of performing the logical operation includes: performing in odd ones or even ones of the stages of the shift register a first NAND operation, which is a NAND operation on the output signal of the flip-flop and the first clock signal; performing in the odd ones or even ones of the stages of the shift register a first NOR operation, which is a NOR operation on a first NAND operation result and the second clock signal; performing in the other ones of the stages of the shift register a second NAND operation, which is a NAND operation on the output signal of the flip-flop and the second clock signal; and performing in the odd ones or even ones of the stages of the shift register a second NOR operation, which is a NOR operation on a second NAND operation result and the first clock signal.

According to the invention, a first NAND operation is performed in odd ones or even ones of the stages of the shift register, and a second NAND operation is performed in the other ones of the stages of the shift register. Consequently, the predetermined logical derivation path can be maintained in a blocked state in each logical derivation stage while the output signal from the flip-flop is inactive by using the inactive output signal from the flip-flop. Therefore, it is possible to hinder the conduction switching operation of a plurality of logical derivation paths with accordance to the periodic level change of the first clock signal or the second clock signal, in each logic derivation stage.

Accordingly, the output signal of the shift register is generated by a first NOR operation which uses the result of the first NAND operation, and a second NOR operation which uses the result of the second NAND operation. This output signal of the shift register can be accepted by the next flip-flop as an input signal. The first clock signal and the second clock signal have a High and Low period equal in lengths, and the first clock signal and the second clock signal are not inphase.

However, the arrangement of the present invention prevents the overlapping of input signals for the flip-flops between stages, thereby preventing the race hazard of the shift register.

As from the above, a driving circuit is easily realized which achieves the effect of (i) preventing the race hazard of the shift register and (ii) suppressing the increase in power consumption and the occurrence of high frequency noise caused by the through current.

The driving method of the present invention for driving the display device may be a method in which the first clock signal and the second clock signal have a High and Low period equal in length, and the first clock signal and the second clock signal are not inphase with respect to each other, the step of performing the logical operation includes: generating, by delaying the output signal of the flip-flop, a delay signal to be inputted to the logical operation circuit; performing in odd ones or even ones of the stages of the shift register a first NAND operation, which is a NAND operation on the delay signal and the first clock signal; performing in the odd ones or even ones of the stages of the shift register a first NOR operation, which is a NOR operation on a first NAND operation result and the second clock signal; performing in the other ones of the stages of the shift register a second NAND operation, which is a NAND operation on the delay signal and the second clock signal; and performing in the other ones of the stages of the shift register a second NOR operation, which is a NOR operation on a second NAND operation result and the first clock signal.

According to the invention, a first NAND operation is performed in odd ones or even ones of the stages of the shift register, and a second NAND operation is performed in the other ones of the stages of the shift register. Consequently, the predetermined logical derivation path can be maintained in a blocked state in each logical derivation stage while the output signal from the flip-flop is inactive by using the inactive output signal from the flip-flop. Therefore, it is possible to hinder the conduction switching operation of a plurality of logical derivation paths with accordance to the periodic level change of the first clock signal or the second clock signal, in each logic derivation stage.

Accordingly, the output signal of the shift register is generated by a first NOR operation which uses the result of the first NAND operation, and the second NOR operation which uses the result of a second NAND operation. This output signal of the shift register can be accepted by the next flip-flop as an input signal. The first clock signal and the second clock signal have a High and Low period equal in length, and the first clock signal and the second clock signal are not inphase. However, the arrangement of the present invention prevents the overlapping of input signals for the flip-flops between stages, thereby preventing the race hazard of the shift register.

With this arrangement, a driving circuit is easily realized which achieves the effect of (i) preventing the race hazard of the shift register and (ii) suppressing the increase in power consumption and the occurrence of high frequency noise caused by the through current.

In addition, the delay signal of the output signal of the flip-flop is used for the first NAND operation and the second NAND operation. Thus, the input signal for the next flip-flop can be properly generated, even if the rising and decaying exponential of the waveform exists in the first and second clock signals and a difference generates in the logical threshold value between the logic gates of the logical operation circuit.

Furthermore, the use of the delay signal allows generating of a double duration pulse as the output signal of the shift register, of which the double duration pulse and an output signal of the shift register two stages later do not overlap with each other.

The driving method of the present invention for driving the display device may be a method in which the first clock signal and the second clock signal have a High and Low period equal in length, and the first clock signal and the second clock signal are not inphase with respect to each other, the step of performing the logical operation includes: generating, by delaying an antiphase signal of the output signal of the flip-flop, a delay signal to be inputted to the logical derivation circuit; generating an intermediate signal by a NOR operation on the delay signal and the antiphase signal; performing in odd or even ones of the stages of the shift register a first NAND operation, which is a NAND operation on the intermediate signal and the first clock signal; performing in the odd or even ones of the stages of the shift register a first NOR operation, which is a NOR operation on a first NAND operation result and the second clock signal; performing in the other ones of the stages of the shift register a second NAND operation, which is a NAND operation on the intermediate signal and the second clock signal; and performing in the other ones of the stages of the shift register a second NOR operation, which is a NOR operation on a second NAND operation result and the first clock signal.

According to the invention, a first NAND operation is performed in odd ones or even ones of the stages of the shift register, and a second NAND operation is performed in the other ones of stages of the shift register. Consequently, the predetermined logical derivation path can be maintained in a blocked state in each logical derivation stage while the output signal from the flip-flop is inactive by using the inactive output signal from the flip-flop. Therefore, it is possible to hinder the conduction switching operation of a plurality of logical derivation paths with accordance to the periodic level change of the first clock signal or the second clock signal, in each logic derivation stage.

Accordingly, the output signal of the shift register is generated by a first NOR operation which uses the result of the first NAND operation, and the second NOR operation which uses the result of a second NAND operation. This output signal of the shift register can be accepted by the next flip-flop as an input signal. The first clock signal and the second clock signal have a High and Low period equal in length, and the first clock signal and the second clock signal are not inphase. However, the arrangement of the present invention prevents the overlapping of input signals for the flip-flops between stages, thereby preventing the race hazard of the shift register.

With this arrangement, a driving circuit is easily realized which achieves the effect of (i) preventing the race hazard of the shift register and (ii) suppressing the increase in power consumption and the occurrence of high frequency noise caused by the through current.

In addition, the delay signal of the output signal of the flip-flop and the intermediate signal which is generated from the delay signal is used for the first NAND operation and the second NAND operation. Thus, the input signal for the next flip-flop can be properly generated, even if the rising and decaying exponential of the waveform exists in the first and second clock signals and a difference generates in the logical threshold value between the logic gates of the logical operation circuit.

Furthermore, the use of the intermediate signal allows generating of a double duration pulse as the output signal of the shift register, of which the double duration pulse and an output signal of the shift register two stages later do not overlap with each other.

The driving method of the present invention for driving the display device may be a method in which the generated input signal for the next flip-flop also functions as an output signal of the shift register.

According to the invention, there is no need to generate a separate input signal for the next flip-flop, other than the output signal of the shift register.

The driving method of the present invention for driving the display device may be a method including generating the output signal of the shift register by a NOR operation on (i) an antiphase signal of the delay signal and (ii) an input signal of the flip-flop following the next flip-flop.

According to the invention, a double duration pulse is easily generated from the delay signal as an output signal of the shift register, of which the double duration pulse and an output signal of the shift register two stages later do not overlap.

The driving method of the present invention for driving the display device may be a method including outputting the intermediate signal as the output signal of the shift register.

According to the invention, a double duration pulse is easily generated as an output signal of the shift register, of which the double duration pulse and an output signal of the shift register of a stage two stages later do not overlap.

The invention being thus described, it will be obvious that the same way may be varied in many ways. Such variations are not to be regarded as a departure from the spirit and scope of the invention, and all such modifications as would be obvious to one skilled in the art are intended to be included within the scope of the following claims.

INDUSTRIAL APPLICABILITY

The present invention is useful in a liquid crystal display device.

The invention claimed is:

1. A driving circuit comprising:
a shift register which includes stages, each of which includes a flip-flop,
each of the stages generating an input signal for the next flip-flop by an MOS type logical operation which uses an output signal of the flip-flop and at least one of a first clock signal and a second clock signal, and
each of the stages generating, from the output signal of the flip-flop, an output signal of the shift register as a drive signal of a display panel, wherein:
each of the stages includes a logical operation circuit for performing the logical operation,
the logical operation circuit includes a first logical derivation stage to which the output signal of the flip-flop and at least one of the first clock signal and the second clock signal are input, the logical operation circuit further including a second logical derivation stage to which an output signal of the first logical derivation stage and at least one of the first clock signal and the second clock signal are input,
based on the output signal of the flip-flop, a first conduction switching operation between a plurality of logical derivation paths which have different power source voltages used in deriving logic is hindered in the first logical derivation stage while the output signal of the flip-flop is inactive, the first conduction switching operation occurring with accordance to a periodic level change of at least one of the first clock signal and the second clock signal,
based on the output signal of the first logical derivation stage, a second conduction switching operation between a plurality of logical derivation paths which have different power source voltages used in deriving logic is hindered in the second logical derivation stage while the output signal of the flip-flop is inactive, the second conduction switching operation occurring in accordance with a periodic level change of at least one of the first clock signal and the second clock signal, and the second logical derivation stage generates (i) the input signal for the next flip-flop and (ii) the output signal of the shift register as the drive signal of the display panel.

2. The driving circuit as set forth in claim 1, wherein:
the first clock signal and the second clock signal have a High and Low period equal in length, and the first clock signal and the second clock signal are not in-phase with respect to each other, and
the logical operation performs in odd ones or even ones of the stages of the shift register (i) a first NAND operation, which is a NAND operation on the output signal of the flip-flop and the first clock signal, and (ii) a first NOR operation, which is a NOR operation on a first NAND operation result and the second clock signal, and performs in the other ones of the stages of the shift register (i) a second NAND operation, which is a NAND operation on the output signal of the flip-flop and the second clock signal, and (ii) a second NOR operation, which is a NOR operation on a second NAND operation result and the first clock signal.

3. The driving circuit as set forth in claim 1, wherein:
the first clock signal and the second clock signal have a High and Low period equal in length, and the first clock signal and the second clock signal are not inphase with respect to each other, and the logical operation (a) generates, by delaying the output signal of the flip-flop, a delay signal to be inputted to the logical derivation circuit, (b) performs in one of either an odd stage or an even stage of the shift register (i) a first NAND operation, which is a NAND operation on the delay signal and the first clock signal, and (ii) a first NOR operation, which is a NOR operation on a first NAND operation result and the second clock signal, and (c) performs in the other one of either the odd stage or the even stage of the shift register (i) a second NAND operation, which is a NAND operation on the delay signal and the second clock signal, and (ii) a second NOR operation, which is a NOR operation on a second NAND operation result and the first clock signal.

4. The driving circuit as set forth in claim 1, wherein:
the first clock signal and the second clock signal have a High and Low period equal in length, and the first clock signal and the second clock signal are not inphase with respect to each other, and the logical operation (a) generates, by delaying an antiphase signal of the output signal of the flip-flop, a delay signal to be inputted to the logical derivation circuit, (b) generates an intermediate signal by a NOR operation on the delay signal and the antiphase signal, (c) performs in odd ones or even ones of the stages of the shift register (i) a first NAND operation, which is a NAND operation on the intermediate signal and the first clock signal, and (ii) a first NOR operation, which is a NOR operation on a first NAND operation result and the second clock signal, and (d) performs in the other ones of the stages of the shift register (i) a second NAND operation, which is a NAND operation on the intermediate signal and the second signal, and (ii) a second NOR operation, which is a NOR operation on a second NAND operation result and the first clock signal.

5. The driving circuit as set forth in claim 1, wherein the generated input signal for the next flip-flop also functions as an output signal of the shift register.

6. The driving circuit as set forth in claim 3, wherein the output signal of the shift register is generated by a NOR operation on (i) an antiphase signal of the delay signal and (ii) an input signal of the flip-flop following the next flip-flop.

7. The driving circuit as set forth in claim 4, wherein the intermediate signal is outputted as the output signal of the shift register.

8. A display device comprising:
a driving circuit and
a display panel, the driving circuit comprising:
    a shift register which includes stages, each of which includes a flip-flop,
    each of the stages generating an input signal for the next flip-flop by an MOS type logical operation which uses an output signal of the flip-flop and at least one of a first clock signal and a second clock signal, and each of the stages generating, from the output signal of the flip-flop, an output signal of the shift register as a drive signal of the display panel, wherein:
    each of the stages includes a logical operation circuit for performing the logical operation,
    the logical operation circuit includes a first logical derivation stage to which the output signal of the flip-flop and at least one of the first clock signal and the second clock signal are input, the logical operation circuit further including a second logical derivation stage to which an output signal of the first logical derivation stage and at least one of the first clock signal and the second clock signal are input,
    based on the output signal of the flip-flop a first conduction switching operation between a plurality of logical derivation paths which have different voltage source voltages used in deriving logic is hindered in the first logical derivation stage while the output signal of the flip-flop is inactive, the first conduction switching operation occurring with accordance to a periodic level change of at least one of the first clock signal and the second clock signal,
    based on the output signal of the first logical derivation stage, a second conduction switching operation between a plurality of logical derivation paths which have different power source voltages used in deriving logic is hindered in the second logical derivation stage while the output signal of the flip-flop is inactive, the second conduction switching operation occurring in accordance with a periodic level change of at least one of the first clock signal and the second clock signal, and
    the second logical derivation stage generates (i) the input signal for the next flip-flop and (ii) the output signal of the shift register as the drive signal of the display panel.

9. A driving method for a display device comprising a driving circuit, the driving circuit including:
a shift register which includes stages, each of which include a flip-flop,
each of the stages generating an input signal for the next flip-flop by an MOS type logical operation which uses an output signal of the flip-flop and at least one of a first clock signal and a second clock signal, and each of the stages generating, from the output signal of the flip-flop, an output signal of the shift register as a drive signal of a display panel, wherein:

each of the stages includes a logical operation circuit for performing the logical operation, the logical operation circuit includes a first logical derivation stage to which the output signal of the flip-flop and at least one of the first clock signal and the second clock signal are input, the logical operation circuit further including a second logical derivation stage to which an output signal of the first logical derivation stage and at least one of the first clock signal and the second clock signal are input, based on the output signal of the flip-flop a first conduction switching operation between a plurality of logical derivation paths which have different power source voltages used in deriving logic is hindered in the first logical derivation stage while the output signal of the flip-flop is inactive, the first conduction switching operation occurring with accordance to a periodic level change of at least one of the first clock signal and the second clock signal, based on the output signal of the first logical derivation stage, a second conduction switching operation between a plurality of logical derivation paths which have different power source voltages used in deriving logic is hindered in the second logical derivation stage while the output signal of the flip-flop is inactive, the second conduction switching operation occurring in accordance with a periodic level change of at least one of the first clock signal and the second clock signal, and the second logical derivation stage generates (i) the input signal for the next flip-flop and (ii) the output signal of the shift register as the drive signal of the display panel.

10. The method as set forth in claim 9, wherein:

the first clock signal and the second clock signal have a High and Low period equal in length, and the first clock signal and the second clock signal are not in-phase with respect to each other, the step of performing the logical operation includes:

performing in odd ones or even ones of the stages of the shift register a first NAND operation, which is a NAND operation on the output signal of the flip-flop and the first clock signal;

performing in the odd ones or even ones of the stages of the shift register a first NOR operation, which is a NOR operation on a first NAND operation result and the second clock signal;

performing in the other ones of the stages of the shift register a second NAND operation, which is a NAND operation on the output signal of the flip-flop and the second clock signal; and performing in the other ones of the stages of the shift register a second NOR operation, which is a NOR operation on a second NAND operation result and the first clock signal.

11. The method as set forth in claim 9, wherein:

the first clock signal and the second clock signal have a High and Low period equal in length, and the first clock signal and the second clock signal are not inphase with respect to each other, the step of performing the logical operation includes:

generating, by delaying the output signal of the flip-flop, a delay signal to be inputted to the logical operation circuit;

performing in odd ones or even ones of the stages of the shift register a first NAND operation, which is a NAND operation on the delay signal and the first clock signal;

performing in the odd ones or even ones of the stages of the shift register a first NOR operation, which is a NOR operation on a first NAND operation result and the second clock signal;

performing in the other ones of the stages of the shift register a second NAND operation, which is a NAND operation on the delay signal and the second clock signal; and performing in the other ones of the stages of the shift register a second NOR operation, which is a NOR operation on a second NAND operation result and the first clock signal.

12. The method as set forth in claim 9, wherein:

the first clock signal and the second clock signal have a High and Low period equal in length, and the first clock signal and the second clock signal are not inphase with respect to each other, the step of performing the logical operation includes:

generating, by delaying an antiphase signal of the output signal of the flip-flop, a delay signal to be inputted to the logical derivation circuit;

generating an intermediate signal by a NOR operation on the delay signal and the antiphase signal;

performing in odd ones or even ones of the stages of the shift register a first NAND operation, which is a NAND operation on the intermediate signal and the first clock signal;

performing in the odd ones or even ones of the stages of the shift register a first NOR operation, which is a NOR operation on a first NAND operation result and the second clock signal;

performing in the other ones of the stages of the shift register a second NAND operation, which is a NAND operation on the intermediate signal and the second clock signal; and performing in the other ones of the stages of the shift register a second NOR operation, which is a NOR operation on a second NAND operation result and the first clock signal.

13. The method as set forth in claim 9, wherein the generated input signal for the next flip-flop also functions as an output signal of the shift register.

14. The method as set forth in claim 11, comprising:

generating the output signal of the shift register by a NOR operation on (i) an antiphase signal of the delay signal and (ii) an input signal of the flip-flop following the next flip-flop.

15. The method as set forth in claim 12, comprising:

outputting the intermediate signal as the output signal of the shift register.

* * * * *